United States Patent [19]
Reeb

[11] Patent Number: 5,041,817
[45] Date of Patent: Aug. 20, 1991

[54] ARRANGEMENT FOR THE INDUCTIVE QUERYING OF AND SUPPLYING OF POWER TO AN ISOLATED CIRCUIT HAVING AN ELECTRICAL CONSUMING DEVICE

[75] Inventor: Max Reeb, Uhingen, Fed. Rep. of Germany

[73] Assignee: Daimler-Benz AG, Fed. Rep. of Germany

[21] Appl. No.: 339,247

[22] Filed: Apr. 17, 1989

[30] Foreign Application Priority Data

Apr. 15, 1988 [DE] Fed. Rep. of Germany ....... 3812630

[51] Int. Cl.$^5$ ............................................. G08B 21/00
[52] U.S. Cl. .................................... 340/635; 340/646; 340/438; 307/10.1
[58] Field of Search ............... 340/436, 438, 635, 646; 307/10.1

[56] References Cited

U.S. PATENT DOCUMENTS 4,853,623  8/1989  Sterler et al. ............... 340/436 X

FOREIGN PATENT DOCUMENTS

| 0087138 | 8/1983 | European Pat. Off. |
| 0183580 | 6/1986 | European Pat. Off. |
| 519825 | 2/1931 | Fed. Rep. of Germany |
| 10362 | 7/1956 | Fed. Rep. of Germany |
| 958600 | 2/1957 | Fed. Rep. of Germany |
| 2235642 | 1/1972 | Fed. Rep. of Germany |
| 3540031 | 2/1987 | Fed. Rep. of Germany |
| 598574 | 4/1978 | Switzerland |

Primary Examiner—Joseph A. Orsino
Assistant Examiner—Jeffery A. Hofsass
Attorney, Agent, or Firm—Evenson, Wands, Edwards, Lenahan & McKeown

[57] ABSTRACT

An arrangement for the inductive querying of and supplying of power to an isolated circuit having an electrical consuming device. The arrangement uses two isolating transformers each with a read winding to simultaneously compare the resistance of the consuming device with that of a simulation device when powered by a low alternating test current. Te arrangement has two outputs for test voltages corresponding to resistance deviations of the consuming device and the reference element, deviate in opposite directions. A bidirectional crosswise transmission of the testing power and the testing signal for the consuming device and the simulation compensates for tolerances of the transformers. When an increased alternating current is fed, the arrangement also causes the efficient supplying of power to the consuming device and a limiting of the power loss at the simulation. A CAN/VAN integratable arrangement performs the testing of and supplying of power to the triggering circuit of a safety system, as well as the inductive supplying of power to a steering wheel computer and the cableless command transmission, for example, for the actuating of signal devices.

68 Claims, 12 Drawing Sheets

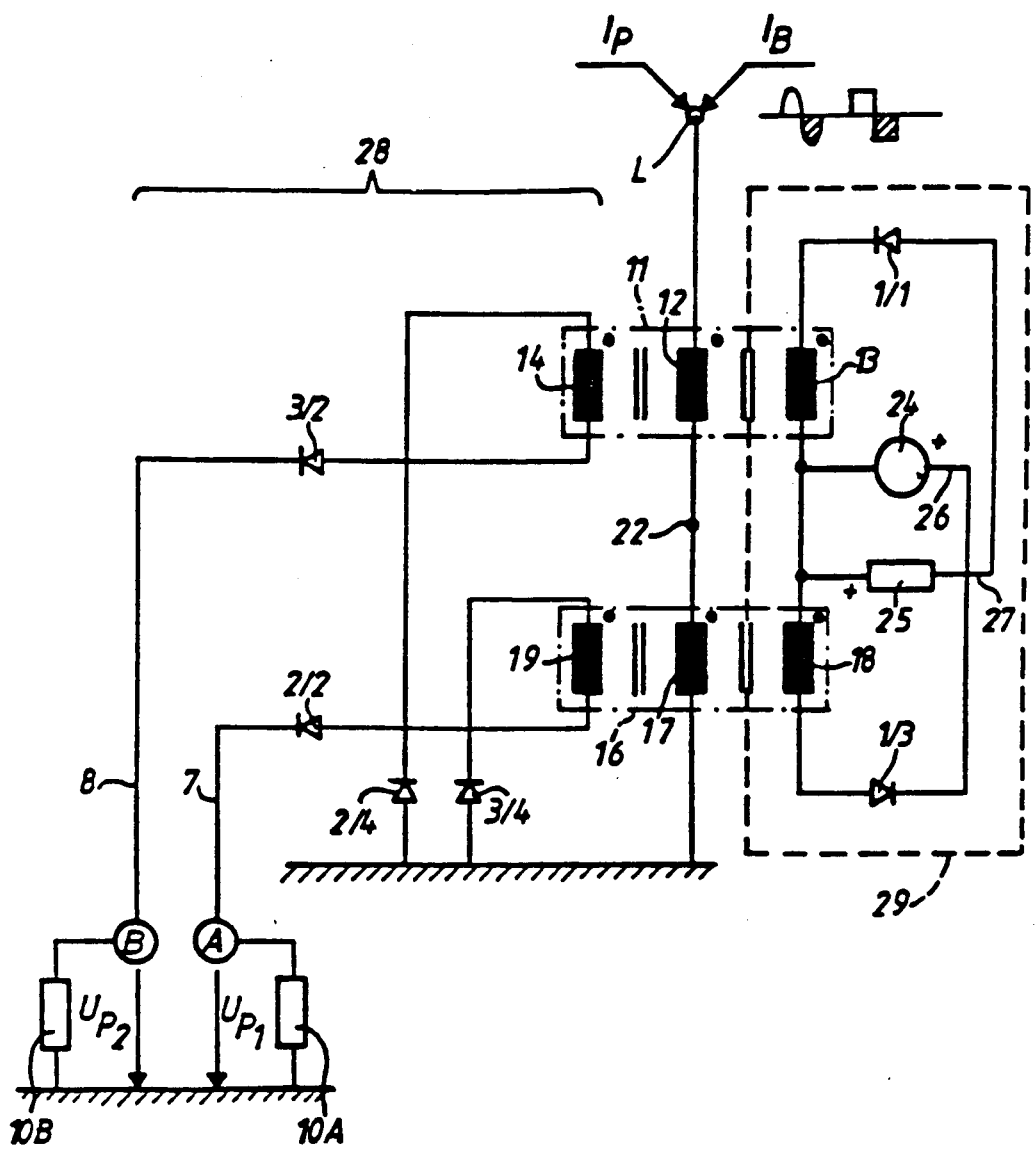

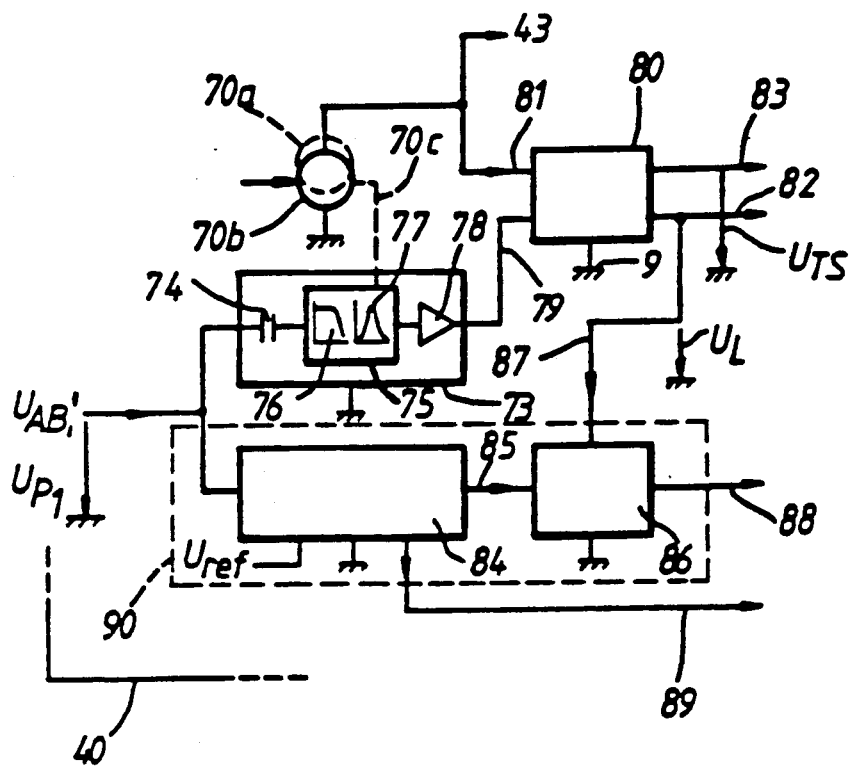
Fig. 7
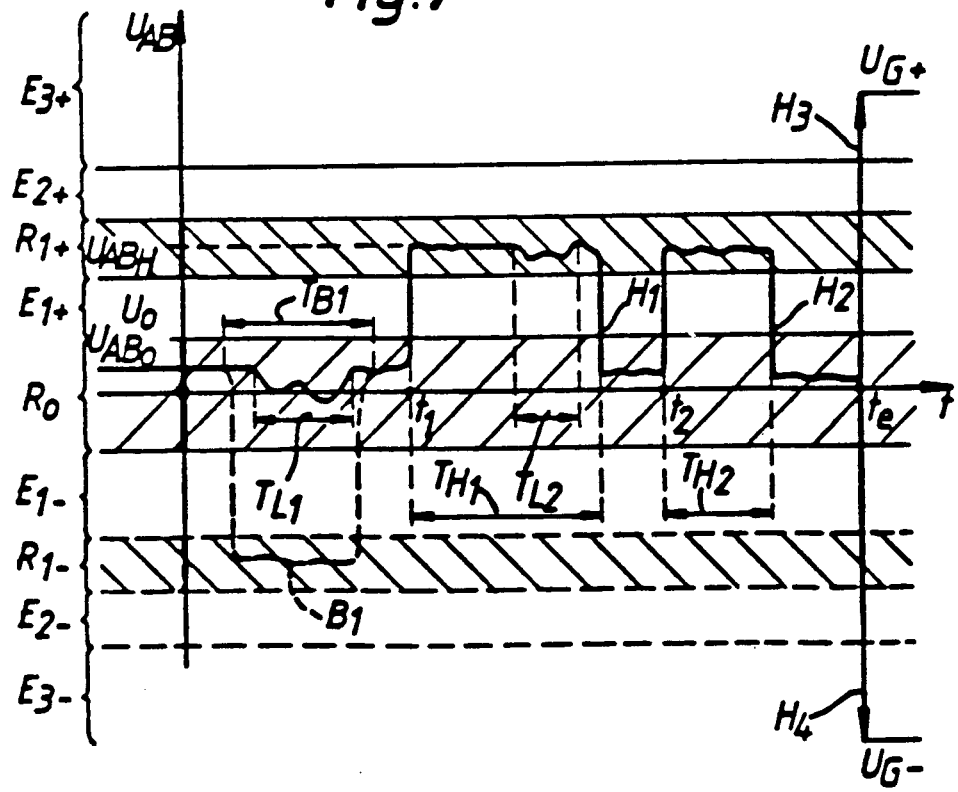

ARRANGEMENT FOR THE INDUCTIVE QUERYING OF AND SUPPLYING OF POWER TO AN ISOLATED CIRCUIT HAVING AN ELECTRICAL CONSUMING DEVICE

BACKGROUND AND SUMMARY OF THE INVENTION

The present invention relates to an arrangement for the inductive querying of and supplying of power to an isolated circuit having an electrical consuming device.

In European Patent Application 183 580, an inductively operating arrangement is disclosed for the transmission of driver-based commands, particularly from the steering wheel of a motor vehicle, to the steering column or to the vehicle chassis. It is suggested there that the secondary winding of a rotary transformer, which, rotatably with respect to the steering column, is connected with the steering wheel, can be loaded, for example, by resistance added to the circuit in a defined manner so that a secondary loading of the rotary transformer is obtained which can be coded according to the driver's intention and sensed at the primary side of the transformer on the steering column. For this purpose, an approximately constant alternating current is provided on the primary side, so that a resulting alternating voltage at the primary winding can be measured to provide a measurement of the load made available on the secondary side. In this sense, the alternating voltage will then be peak-value-rectified and quantized in order to assign different driver commands to different load conditions.

That arrangement, however, does not carry out any testing or monitoring query of the circuit to ascertain whether the resistances 53 to 57 to be controllably added to the circuit actually correspond to defined desired values (within permissible tolerances), and were not changed unacceptably by aging or defects. As a result, a faulty resistance in any arrangement may easily be analyzed to be an incorrect driver-based command.

For corresponding reasons, in any arrangement, the isolating transformer must be manufactured with high precision and, for example, in the case of a rotary transformer, must be manufactured with close tolerances of the air gap and of the leakage inductance with respect to the angles of rotation and over the operational lifetime of the transformer. Otherwise, certain tolerances or changes of the transformer, on the primary side, may simulate incorrect load conditions, on the secondary side, and lead to incorrect interpretations of driver-based commands.

It is also unsatisfactory that no possibility exists in the above-noted arrangement to query the condition of the transformer. Because of the high cost of a precisely manufactured and mountable rotary transformer as well as because of the indicated inherent safety defects, the known device is not suitable, for example, for use in an occupant protection system of a vehicle which must be available for operation at any moment.

In European Patent Text 87 138, a device is also disclosed for the inductive supplying of power to a circuit arrangement which is rotatably provided at vehicles. That text discloses the supplying of a pressure sensor as a component of a tire pressure monitoring device. That arrangement provides the supplying of operating power to a data acquisition and transmitting device by a rotary transformer. For this purpose, the primary side and the secondary side of the rotary transformer are constructed to be rotatably movable with respect to one another. The inductively transmitted power is used mainly for controlling an optoelectronic emitter (LED) having an output corresponding to an actual pressure value in order to transmit the pressure value by way of light from the rotatable circuit part to the stationary port. For this purpose, an optoelectronic data receiver is provided in the stationary circuit part and controls a device for displaying or representing the momentary measured value and a discriminator circuit which reduces the control power of the transformer.

Because of high losses when the power demand of the noted circuit arrangement is high on the secondary side (data transmission; operation), this discriminator circuit is provided in order to achieve a reduction of the power loss, particularly in the rotary transformer, when the power demand on the secondary side is low (no data transmission; standby), by a reduction of the control power of the rotary transformer to a standby value, and, as a result, considerably increase the efficiency of the device during standby periods. On the whole, the aforementioned arrangement aims at an overall operating power that is as low as possible, and therefore at a control power of such a transformer that is as low as possible when the power demand on its secondary side is also low.

The query or transmission of status information in the case of safety devices, for example, at a manufacturing machine or in a motor vehicle, and particularly of a type of information that is needed only in emergency situations (such as reports of danger, accident), requires a maximum availability of the information. Thus, simplicity is required and as a result it is desirable to use the smallest possible number of structural elements which have a proven, high, long-time reliability. Even for modern LEDs, the reliability characteristic of the device applies only to a limited extent if they are subjected to extreme stress, as, for example, in a motor vehicle. The danger of the effect of dirt also impaired the availability of a testing device where a testing signal is obtained optically from the moving part. Thus, a use of the aforesaid arrangement for the contactless query of a safety-relevant output variable could hardly promise a sufficiently reliable availability of operation because of the problems associated with LED operation as well as an excessive number of required structural elements.

It is, therefore, an object of the present invention to provide, in a particularly simple manner, an arrangement for the inductive querying of the operational status of an electrical consuming device, such as a triggering device of an air bag occupant restraining system, such that a testing of the consuming device and of its electrical circuit with respect to its faultlessness is possible in a simple way.

It is another object of the present invention to provide an arrangement wherein certain deviations of the transmission characteristics of an inductive transmitting device, for example, an isolating transformer, resulting from the manufacturing process, can be compensated and are therefore permissible.

It is a further object of the present invention to provide an arrangement wherein it is possible to test this inductive transmitting device itself in the course of a testing or monitoring of the consuming device.

Without any loss of definiteness of the test information concerning the operational status of the consuming device to be queried, it is an advantageous feature of preferred embodiments of the present invention that a cost-effective isolating transformer, with less stringent manufacturing and mounting tolerances, is used as a result of the fact that the isolating transformer is provided twice. Any tolerances of the two transformers, with respect to one another, are compensated by the fact that they each equally supply the consuming device in a first current path and a consuming device simulation in a second current path with a testing current, and that the querying of both loads represented by the consuming device and simulation device takes place by special read out winding which are associated with both transformers. As a result of the two-path feeding of testing current and querying, the arrangement permits the recognition of a defect at a transformer.

It is an additional object of the present invention to provide an arrangement of the type noted above which, under certain conditions, supplies a definite operating power to the consuming device in a particularly effective manner.

Certain preferred features of embodiments of the present invention provide the advantage that, when the feed current is low, it permits the comparing of the consuming device with a simulation device of the consuming device by a test current which is equalled proved by to both the consuming device and simulation device. However, when a higher operating current is provided, a predominant part of the feed power is fed to the consuming device as operating power and only a small part of the feed power is provided to the simulation device as a power loss, so that the consuming device-related power transmission efficiency increases considerably when the feed current of the arrangement is increased and as a result permits a low-cost design of a feed generator circuit which generates the total feed power. Thus, additional measures for avoiding unnecessary power losses in the querying operation are not required.

Other objects of the invention include further developing the arrangement according to the teachings of the present invention wherein, by means of feeding and analyzing devices provided, it is always possible to continuously and extremely reliably test the consuming device and its availability and reliably start operation of the consuming device from the testing status state and that the occurrence of a defect of the consuming device cannot remain unnoticed under any circumstances.

In addition, a further feature of the invention is the ability to issue at least one command from the isolated circuit without, in any way, limiting the ability of the consuming device to be tested.

All in all, the arrangement according to the preferred embodiments of the present invention offers the advantage of a simple circuit for testing, as well as for operating, an isolated consuming device. In addition to inductive isolating transformers, the arrangement comprises, in its basic structure, only three additional, identical structural elements, and a device simulating the consuming device. The transmission of the operating and testing power as well as the querying of the operational readiness of the consuming device take place by the same air gap of a doubled isolating transformer. With the simultaneous comparison of the consuming device with a simulation via alternating feeding and querying paths, a testing voltage and a reference voltage are formed which, also without any booster amplification or other additional supplementary circuitry (i.e. reasonably with respect to cost), is capable of directly controlling modern microcomputers and their standard interfaces with a high signal-to-background noise ratio.

Without any impairment of the querying operation of the consuming device and its simulation, a low direct current may also be derived from the isolated circuit. For example, the low current can be provided as a power supply for the operation of a small computer and/or display device, which may also be backed up, in a nonvolatile manner, by a bufferable power source, such as a secondary battery or a high-capacity capacitor.

The use of only a few proven structural elements, having a high reliability of operation, results in a high reliability of operation of the arrangement and permits its application as a component of safety systems. In this connection, it is suitable, for example, for the testing and, if necessary, also for supplying power to a triggering device or triggering dot at the steering wheel of a motor vehicle which is essential for safety purposes such as, for example, in an occupant restraining air bag system.

The arrangement, which is further developed by supplementary feeding and analyzing devices, also permits a cableless triggering or actuating of at least one operating device remote from the isolated circuit. For example, the horn or the emergency flasher system of a motor vehicle may be triggered. The various embodiments of the invention, which are provided for this purpose in many different designs, open up additional efficient safety functions for recognizing a defect and for ensuring its fast elimination.

One embodiment of the present invention utilizes the amplifierless direct-controllability of a modern single-chip A/D micro-controller in which a plurality of analog functional elements are not required. Acquisition of command data and status quantities as well as associated processing into operating signals or defect reports is accomplished exclusively by software. Among other things, this arrangement, when it is programmed appropriately, can learn its own manufacturing tolerances, permitting a soft compensation of its specific tolerances. In a vehicle, it may, for example, cooperate with a vehicle management computer for the processing of service demands by voice output.

Although the arrangement, in accordance with preferred embodiments of the present invention, is discussed for use in a motor vehicle and its method of operation is explained by an illustrative application of embodiments to a motor vehicle, the possibilities for its use are by no means limited to a motor vehicle. The arrangement may equally well be used in water vehicles, track-guided vehicles, air and space vehicles, underground in a potentially explosive environment or even at operating interfaces of machine tools.

Other objects, advantages and novel features of the present invention will become apparent from the following detailed description of the invention when considered in conjunction with the accompanying drawings.

BRIEF DESCRIPTION OF THE DRAWINGS

FIG. 4b is an excerpt from the schematic operating circuit diagram according to FIG. 3, showing circuit paths of the arrangement that are operative during negative current half-waves of a feeding quantity;

FIG. 7 is a diagram of the variation in time of the signal voltage between terminals [A] and [B] when the operating device is triggered, or when a defect occurs in the consuming device or its simulation;

FIG. 9 is a block diagram of a control device as a component of an electronic feeding and analyzing system according to FIG. 6;

DETAILED DESCRIPTION OF THE DRAWINGS

Figure 1:
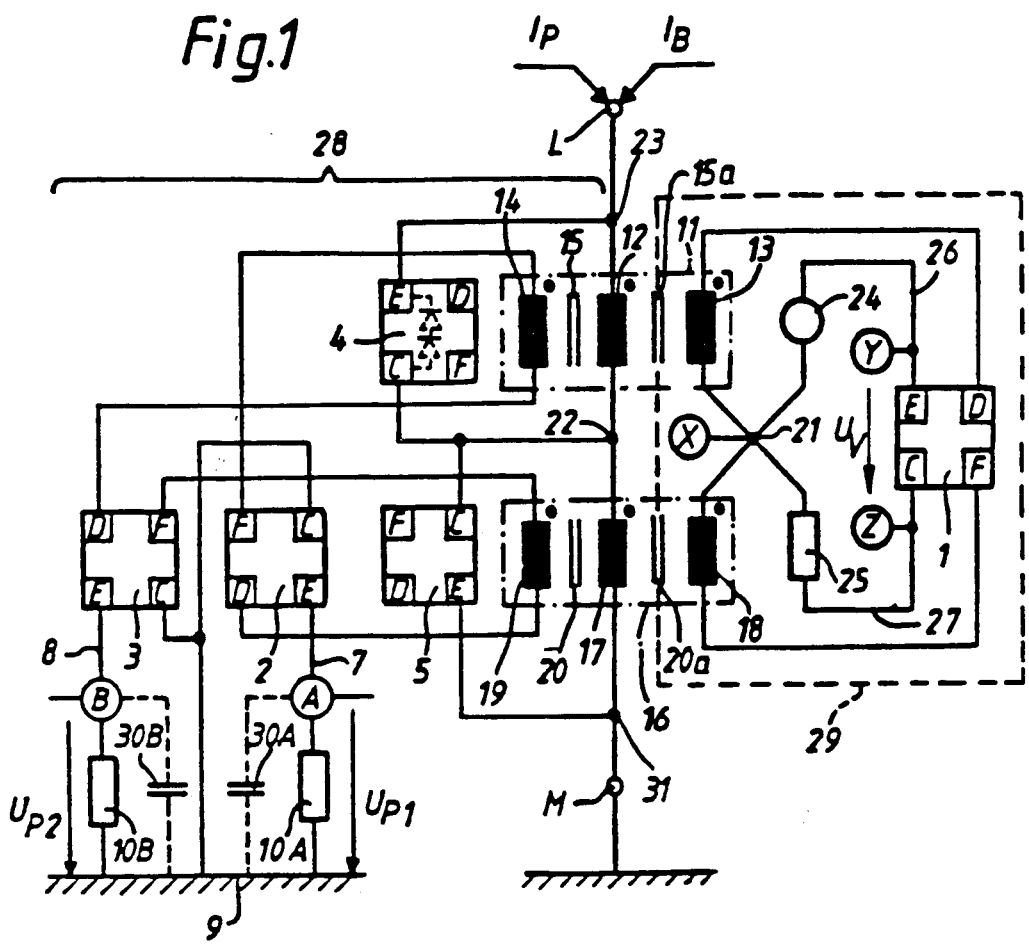
FIG. 1 is the wiring diagram of a first embodiment of the arrangement, according to preferred embodiments of the present invention, on which further developments are also based.

Three embodiments of the arrangement according to the invention are shown in the drawings and are explained in detail in the following description.

Figure 2:
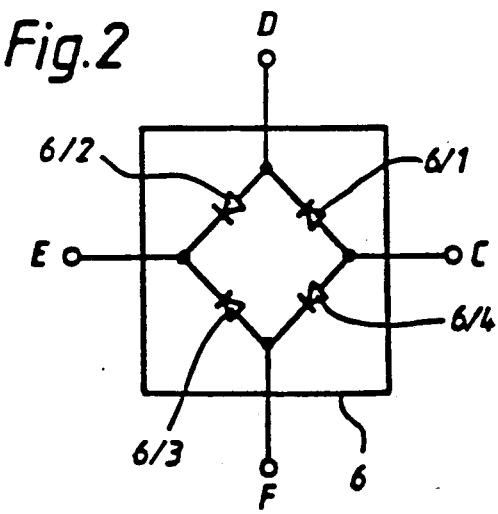
FIG. 2 is a schematic circuit diagram of a multiple series connection, of which several are provided in the arrangement according to the teachings of the present invention.

According to FIG. 1, the arrangement, in the simplest case, in addition to the consuming device 24 and to a compare element 25 simulating this consuming device 24, comprises two isolating transformers 11 and 16 and at least three identically bridge rectifiers constructed as multiple series connection switching elements 1 to 3 which are constructed according to the multiple series connection switching element 6 shown according to FIG. 2 to provide alternative circuit paths in dependence on the polarity of an oscillating AC current.

This multiple series connection switching element 6 represents a known bridge circuit comprising four semiconductor switch or valve paths 6/1 to 6/4 formed, by example, by diodes which are arranged in paris in two homopolar parallel circuit paths with a common line C on the anode side, a common line E on the cathode side, and a first and second center tap D and F. Such valve bridge circuits are used, for example, as rectifiers in electronic equipment and are available at a reasonable price as single-body structural elements.

Two additional multiple series connection switching elements 4 and 5 are provided, which represent semiconductor valves, particularly diodes, with an appropriately selected threshold voltage. In practice, identical multiple series connection switching elements may also be provided for this purpose, in which the corresponding center taps 4D and 4F or 5D and 5F are disconnected or eliminated. The parallel connection of the two valve paths formed by elements 4 and 5, respectively, proves to be advantageous as will be described more fully below with respect to transmitting operating power to the consuming device 24 with little loss in the simulation 25 because the operating current of the consuming device 24 flows via the switching elements 4 and 5. In this case, the multiple series connection switching element 1 to 5 may therefore be implemented by identical structural elements. To this extent, FIG. 1 demonstrates the simplicity of the basic structure of the arrangement according to the invention.

Figure 3:
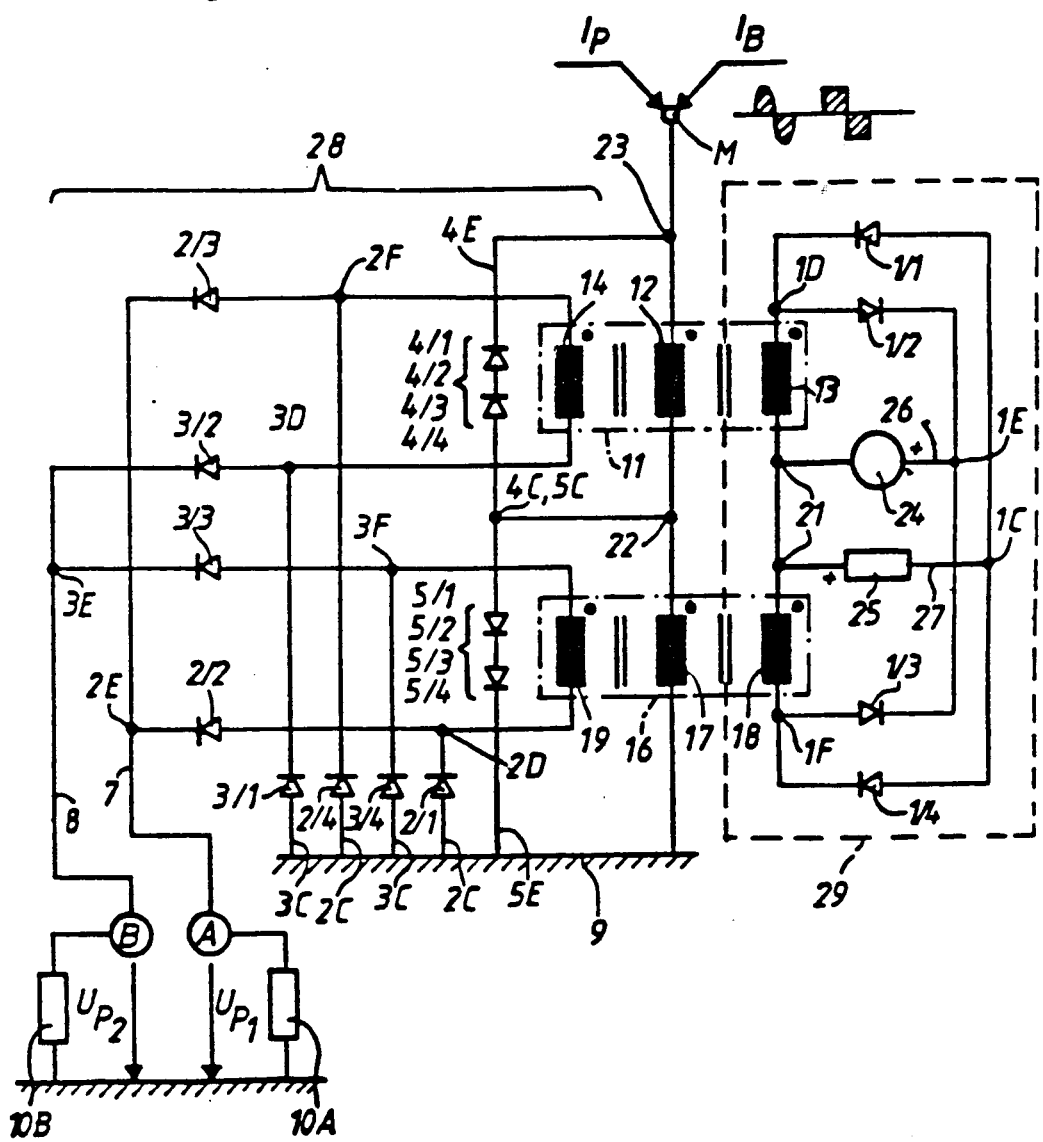
FIG. 3 is a schematic operating circuit diagram of the first embodiment of the arrangement according to preferred embodiments of the present invention.
Figure 4A:
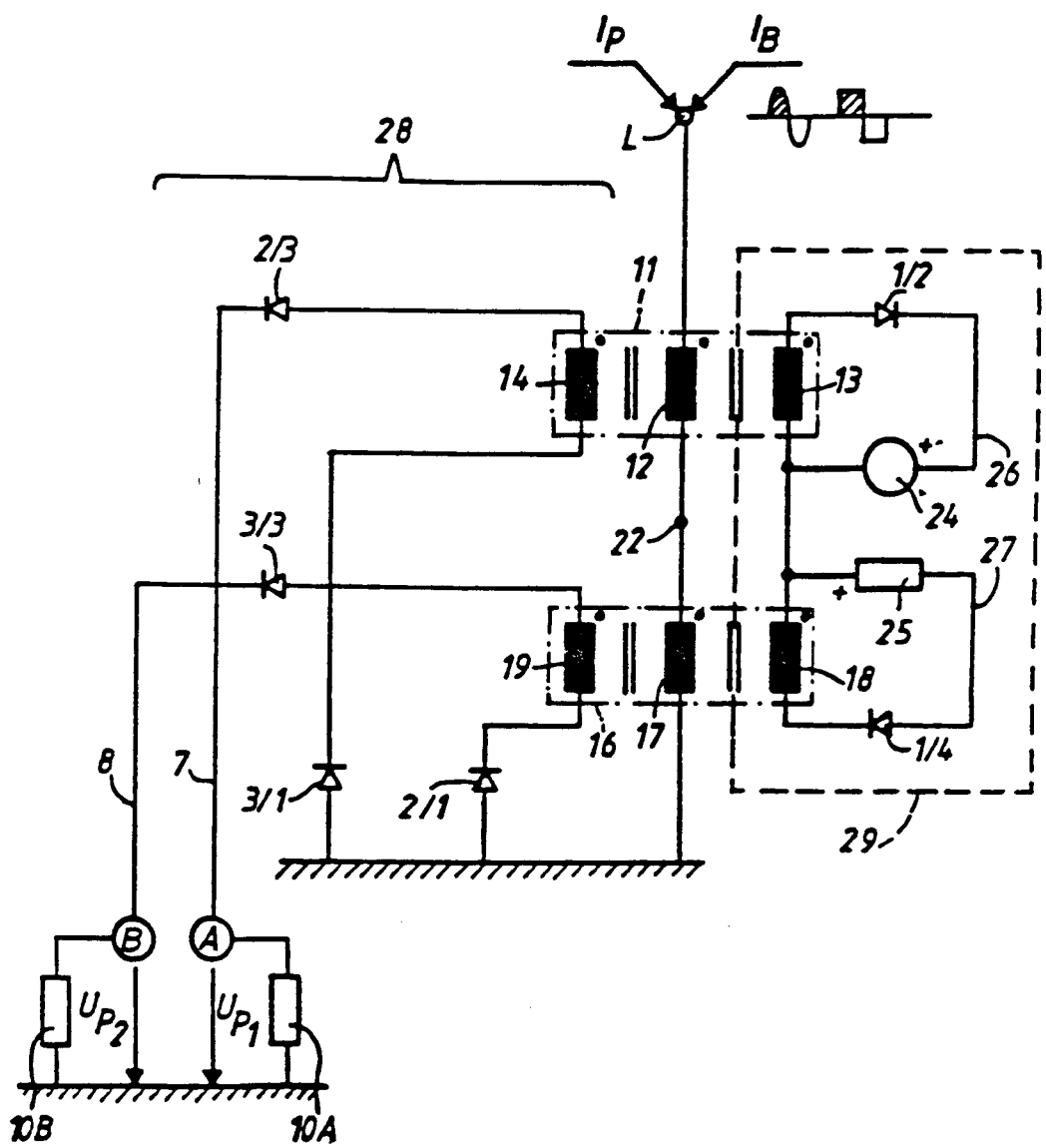
FIG. 4a is an excerpt from the schematic operating circuit diagram according to FIG. 3, showing circuit paths of the arrangement that are operative during positive current half-waves of a feeding quantity.

The overall schematic operating diagram according to FIG. 3 and excerpts of this diagram according to FIGS. 4a and 4b illustrate the operation and effect of the arrangement in detail. The isolating transformers 11 and 16 each have a corresponding primary winding 12 and 17. The end of primary winding 17 is connected with the start of primary winding 12. Primary winding 12 is connected to a distribution node 23 into which a testing or operating alternating current $I_P$ or $I_B$ can be fed by a feeder terminal [L]. Correspondingly, primary winding 17 is connected to an opposite-pole collector node 31 which, by an opposite-pole terminal [M], may preferably be connected with a mass potential or ground 9 as shown in FIG. 1 to facilitate flow of the testing or operating alternating current through the transformers 11, 16 and associated circuitry and accommodate leakage inductance of the transformer 11, 16.

A readout circuit 28 is assigned to the primary windings 12, 17. This readout circuit 28 is fed from readout windings 14 and 19 which are coupled with corresponding primary windings 12 and 17. This coupling of windings is supported by suitable field guiding devices 15 and 20 having the function of transformer cores. All lines of the readout windings 14 and 19, via semiconductor valve paths 2/1, 3/1, 2/4, 3/4, each having the same polarity with respect to the alternating feed current, are connected to the reference potential mass 9. These lines, via semiconductor valves 2/2, 3/2, 2/3, 3/3 arranged with a polarity opposite to valve paths 2/1, 3/1, 2/4, 3/4, are also connected to two readout terminals [A] and [B] by readout lines 7 and 8, respectively. The shown polarity of the valves (anodes at the reference potential mass 9; cathodes at terminals [A] and [B]) is random, and may also be reversed, depending on the turning and coupling direction of the windings 12 and 14 or 17 and 19.

Secondary windings 13 and 18, together with the consuming device 24 and the simulation device 25, form an isolated circuit 29, which is fed with power from the mentioned secondary windings 13 and 18 coupled with corresponding primary windings 12 and 17. This coupling is carried out by suitable field guiding devices 15a and 20a which preferably may contain an air gap between the primary and the secondary windings.

Analogously to the primary windings 12, 17, the secondary windings 13, 18 are connected in series in a voltage-adding manner. In addition, first lines of the consuming devices 24 and its simulation device 25 are also connected to the corresponding connection point 21 for secondary windings 13, 18. The other ends of the secondary windings 13, 18, via two respective semiconductor valves 1/2 and 1/1 or 1/3 and 1/4 connected with opposite poles, in the manner of a full wave rectification, feed the consuming device 24 and the simulation device 25 with opposite polarity relative to connection point 21. The connection point 21 is preferably connected with a measuring point [X] best shown in FIG. 1. Corresponding measuring points [Y] and [Z] are assigned to the other line of the consuming device 24 and of the simulation device 25 as also shown in FIG. 1.

The primary windings 12, 17 are bridged by corresponding valve arrangements 4/1 to 4/4 and 5/1 to 5/4, the anode sides, in each case, being applied to the central connection point 22 of these primary windings 12, 17.

In operation, when a positive testing current half wave flows through the primary windings, the alternate circuit according to FIG. 4a is operative. The consuming device 24 and the readout terminal [A] assigned to it are fed with direct voltage from transformer 11; the simulation device 25 and the readout terminal [B] assigned to it are fed with direct voltage from transformer 16. In this case, valve 1/2 in current path 26 of the consuming device 24, valve 1/4 in current path 27 of the simulation 25, valves 2/3 and 3/1 in the circuit leading to readout terminal [A], and valves 2/1 and 3/3 in the circuit leading to readout terminal [B] are conductive; the remaining valves are nonconductive and thus current flow in the associated current paths is blocked.

When a negative testing current half wave flows through the primary windings 12, 17, the alternate circuit according to FIG. 4b is operative. The consuming device 24 and the readout terminal [A] assigned to it are fed with direct voltage from transformer 16; the simulation device 25 and the readout terminal [B] assigned to it are fed with direct voltage from transformer 11. In this case, valve 1/3 in current path 26 of the consuming device 24, valve 1/1 in current path 27 of the simulation device 25, valves 2/2 and 3/4 in the circuit leading to readout terminal [A], and valves 3/2 and 2/4 in the circuit leading to readout terminal [B] are conductive; the remaining valves are nonconductive and thus block current flow in the associated current paths.

Therefore, depending on the polarity of the applied half wave, the consuming device and the simulation device are alternately crosswise supplied from transformers 11 and 16. The same applies to the testing terminals [A], [B]. If sufficiently large load capacitors 30A and 30B and sufficiently high-impedance load resistances 10A and 10B are connected to terminals [A] and [B], a peak value rectification takes place, and therefore smoothed direct voltages are available at terminals [A] and [B] as the testing voltages. A suitable constant testing current $I_P$ is selected such that the threshold voltage of the valve paths 4/1 to 4/4 and 5/1 to 5/4 according to FIG. 3 is not reached. These valves are therefore not shown in FIGS. 4a and 4b.

When an increased alternating operating current $I_B$ for operating the consuming device 24 is fed into the distribution node 23, the amplitude of the alternating voltage that can be transmitted to the simulation device 25 (prior to the rectification in circuit 29) is limited to the threshold voltage of the above-mentioned valve paths. This means that, minus this threshold voltage, the whole remaining voltage drop across both primary windings can be utilized for the feeding of the consuming device.

When the threshold voltages of valves 1/1 to 1/4 are not taken into account and when an amplitude ratio of 4:1 of the alternating voltages, which in this manner can be transmitted to the two secondary windings 13, 18, is used as a basis, the ratio of the power that can be converted in the consuming device 24 and in the simulation device 25, each having the same resistance, is 16:1. Therefore, less than 10% of the total fed power will then be lost in the simulation device 25 as a power loss. When the resistances of the consuming device 24 and of the simulation device 25 are low, Schottky diode paths are advantageously used as the valves. Corresponding bridge circuits are known from the field of switched power supply units in the form of single-body integrated fourpole components.

According to the voltage at the primary windings 12, 17 desired in practice or resulting from the testing current $I_P$ or operating current $I_B$, an optimal resolution between the consuming device 24 and the simulation device 25 in the testing operation will be reached when, in each case, in a series arrangement, two to four normal semiconductor valve paths are connected in parallel to the primary windings 12, 17. By this type of an optimizing dimensioning, a particularly low-cost production of the two transformers 11, 16 may be achieved, in that their windings may then have only the same number of turns or number of turns that differ in whole multiples (multifilar automatic winding).

Since, when the feeding of current into the distribution node 23 is increased, the mentioned limiting of the amplitude of the alternating voltage that can be transmitted to the simulation device 25 will take place even if the simulation 25 is defective or its associated circuit path 27 is interrupted, valve paths 4/1 to 4/4 and 5/1 to 5/4, irrespective of the condition of the simulation device 25, ensure a reliable operatability of the consuming device 24, which is an important criterion, for example, for a use in protection systems requiring a high inherent reliability.

Figure 5:
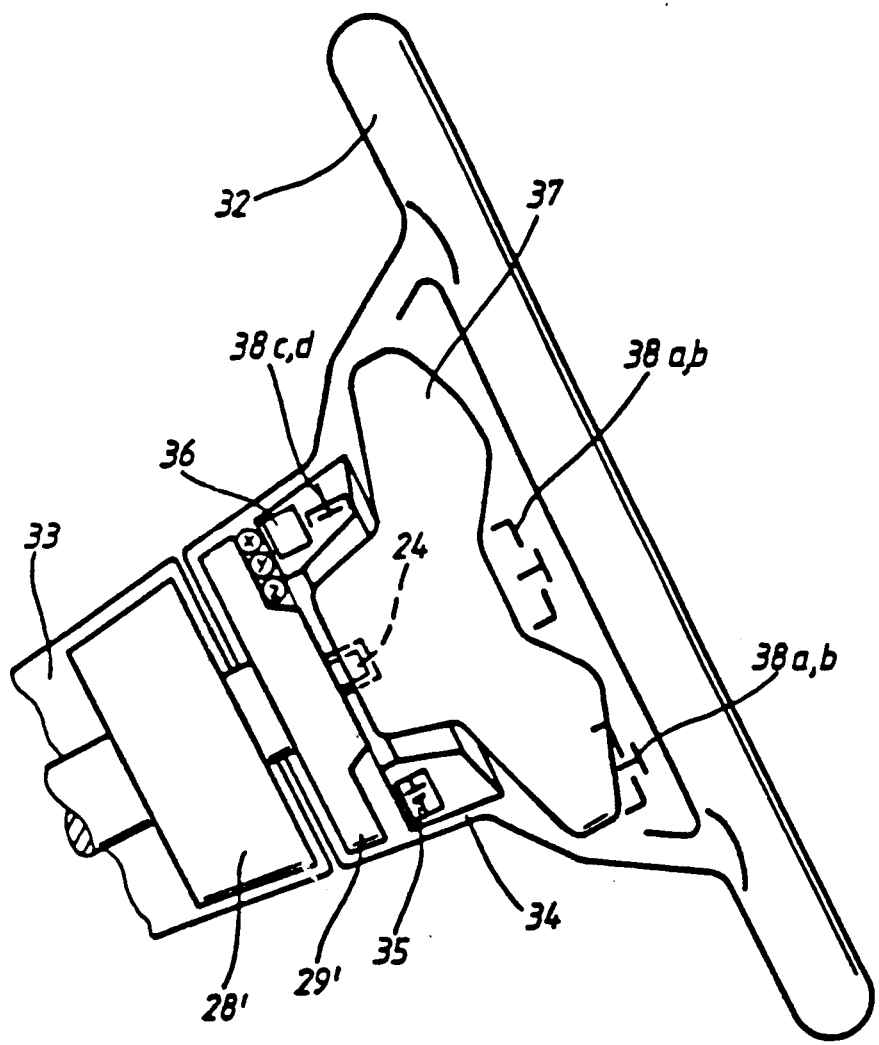
FIG. 5 is a schematic view of an example of the housing of parts of the arrangement in or at a vehicle steering wheel.

If the two transformers 11 and 16, preferably integrated in one part 28' on the primary side and in another part 29' on the secondary side, are constructed as isolating transformers, this arrangement is suitable, for example, also for the continuous testing query of a triggering device for an occupant protection system in a steering wheel as shown in FIG. 5. If implemented for this type of a use as rotary transformers of a concentric structure, possible air gap fluctuations of the transformer are compensated for by the angle of rotation between the primary and secondary parts 28', 29', in that successive feeding half waves for the secondary loads are acquired alternately by both transformers 11, 16.

Because an inductive bridge principle is applied for transmitting power to the secondary loads, the direct-voltage proportions of the two testing voltages $U_{P1}$ and $U_{P2}$, in the case of circuit changes (such as a defective soldering point, a wire break) or aging or failure of a component, always change in opposite directions.

As a result, not only can both transformers 11, 16 be generally monitored with respect to their operation, but, in the case of a quantized analyzing of both testing voltages $U_{P1}$ and $U_{P2}$, even defects in the primary, secondary and readout windings of both transformers 11, 16 can be localized. As a result, a very high inherent reliability of operational readiness can be achieved, and in the course of repair measures, an unnecessary exchange of one of the two arrangement parts 28' and 29' may also be avoided.

The above-noted characteristics, combined with low circuit expenditures and the use of a minimum number of high-temperature-resistant structural components, make this arrangement seem particularly suitable, for example, for use in a motor vehicle for the constant monitoring and operation of a electrical igniting pallet 24 in the steering wheel 32 as a component of an occupant protection device 37 such as, for example, an air bag restraining system. According to FIG. 5, the arrangement 29 will then be housed, for example, in the movable part 29' of the steering wheel 32, while the primary windings 12 and 17, together with the remaining readout circuit 28 in part 28' will be disposed, for example, in a stationary manner at/in the steering column 33. Details of the design of the rotary transformers 11 and 16 are not shown in this schematic view. In order to implement a sufficiently small and/or twisting-angle-independent air gap, preferably coaxial primary and secondary magnetic field guiding elements may engage in one another in a contactless manner.

Since, in this type of an application, the consuming device, for example, the triggering device 24 and the simulation device 25 have a relatively low resistance (such as 2.5 Ohm), and since, between the consuming device 24 and the simulation device 25, twice the value of the individual direct voltages across the resistance is always available as a result of the testing current impression at the electrical igniting pallet 24 and the simulation device 25, a sufficiently high direct voltage $U_V$ may be tapped, for example, between points [Y] and [Z], in order to supply additional electronic devices 34 such as, for example, a CMOS steering wheel computer, in the steering wheel 32 without the need of a direct contact or slip-ring connection with a low operating power. This type of a device 34 will then obtain its complete operating current from the primary testing current $I_P$ impressed into the feeder terminal [L], so that the arrangement according to the invention, when used correspondingly, may also operate as a slip-ringless micro power supply system for components of rotatable wheel, such as, a steering wheel.

As long as the direct current drawn at points [Y] and [Z] is not too high compared to the current fed into the trigger dot 24 and the simulation device 25, the readout resolution of the two testing direct voltages $U_{P1}$ and $U_{P2}$ does not suffer any significant negative effect, because a current derived in this manner loads both bridge branches of the current paths 26 and 27 in parallel and crosswise to the same extent. Thus, the arrangement at the readout terminals [A] and [B] responds predominantly to the asymmetry of the current acquisition of the two current paths 26 and 27. This type of an auxiliary device 34 can also measure the supply direct voltage tapped at Points [Y] and [Z] and indicate a deviation outside permissible limits so that, as a result, the steering wheel arrangement described above itself, independently of a vehicle computer, can monitor and report the readiness to operate or not operate of, for example, an airbag system.

In addition, an auxiliary device 34 of this type may also be equipped with a chargeable power storage device, such as a GoldCap Device or a battery 35, which is buffered continuously under testing conditions, so that even, when the steering wheel is removed, data stored in this type of an auxiliary device cannot be lost. This auxiliary device 34 may also contain a clock 35 and can be connected to the center point [X], so that, for example, by the reaction bounce at the trigger dot 24, when it is triggered, such a clock is stopped, and a point in time of an accident can be precisely stored in the steering wheel.

Figure 6:
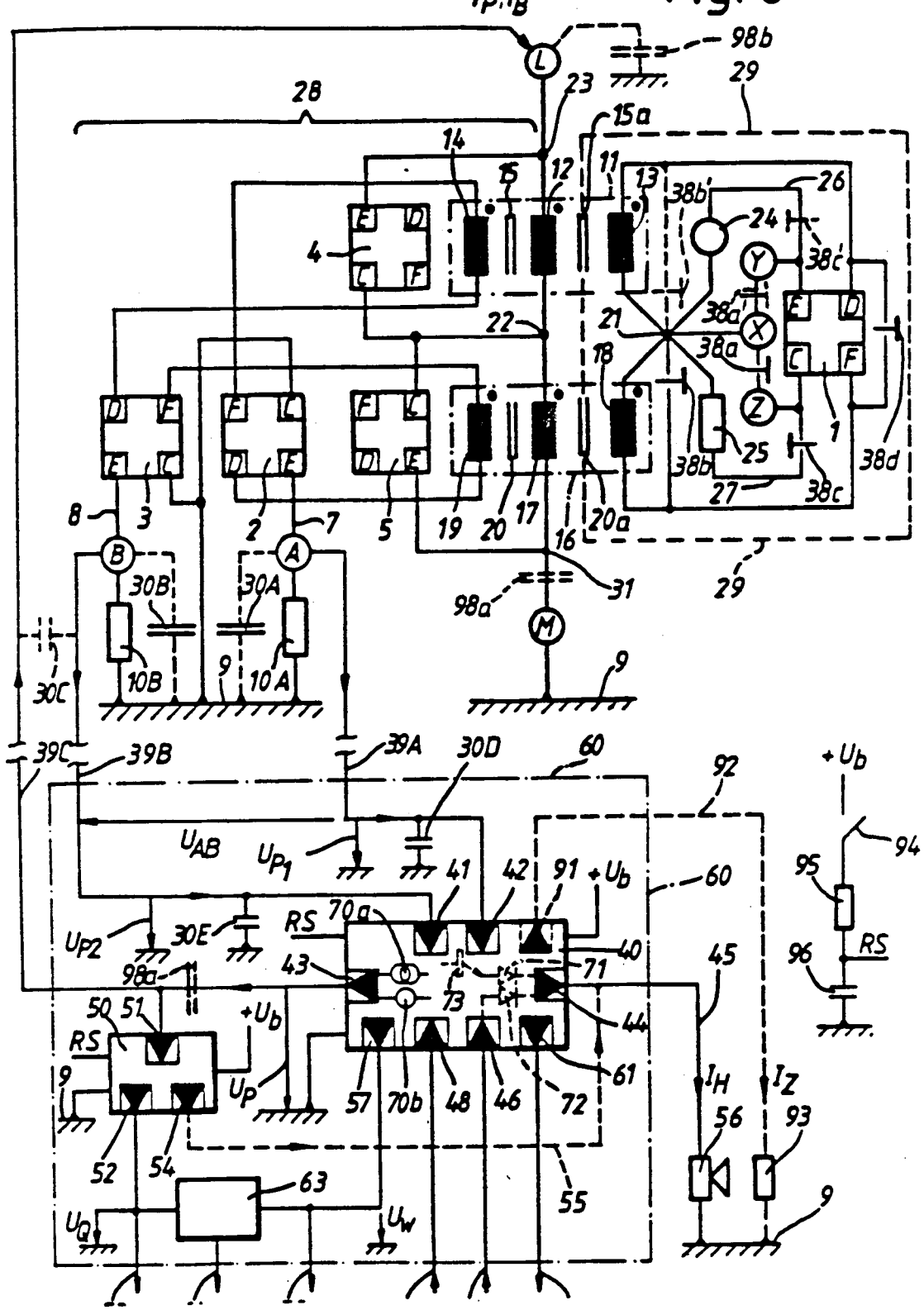
FIG. 6 is a block diagram of a second embodiment of the arrangement according to the teachings of the present invention which permits the triggering of at least one operating device as well as the testing of essential components and operations of the arrangement from the isolated circuit.

FIG. 6 shows another embodiment of the invention which is obtained by adding elements to the construction known from FIGS. 1 and 3. In the testing or monitoring condition, i.e., when a relative low value testing current $I_P$ is fed to terminal L of this construction, in addition, this embodiment permits the inductive transmission of at least one short-time switch-on function from the isolated circuit 29 to a remote operating device 56 such as, for example, a horn. For this purpose, a closing touch contact switch 38a is provided, for example, between points [X] and [Z], which bridges the simulation device 25 for the duration of its actuation. In this case, a special electronic feeding and analyzing system 60 carries out the recognition of an actuation of switch 38a.

As an alternative or in addition, a corresponding touch contact switch 38b may be provided which short-circuits the secondary winding 18 of the rotary transformer 16 when the switch is actuated. As an alternative or in addition, an opening touch contact switch 38c may be provided which, when it is actuated, interrupts the current path 27 of the simulation device 25. As an alternative or in addition, another touch contact switch 38d may be provided which, when it is actuated, short-circuits the series connection of both secondary windings 13 and 18.

In principle, it may be just as well to provide a corresponding touch contact switch 38a' also between points [X] and [Y] and a corresponding touch contact switch 38c' in series with the consuming device 24. However, in view of safety aspects, a parallel or series wiring of the consuming device 24 as a component of a safety device may not be permissible. According to which circuit points in the isolated circuit 29 are short-circuited or are broken by a corresponding touch contact switch, a different reading voltage is obtained between terminals [A] and [B] or between the latter and reference potential mass 9. This (these) read voltage(s) can be analyzed specifically for both the querying of the operational status of the circuit or for the issuance of an actuating command from the isolated circuit 29.

At least one of these touch contact switches may, for example, be the triggering contact for the actuating of the horn of a motor vehicle, which, according to FIG. 5, such contact switches as a component of circuit part 29 being housed in the steering wheel 32. It should be noted that the inductively operating touch contact switch function may naturally be implemented just as well when parts 24 and 25 are left out which are then superfluous and when the analyzing of the reading voltages $U_{P1}$ and $U_{P2}$ is adapted correspondingly.

Without any restriction of the generalities, the further description of the operation is based on a use of the arrangement according to the invention in a motor vehicle. The expert will easily recognize that it is just as suitable for use in other areas, for example, in track-guided vehicles, water vehicles, air and space vehicles, underground in a potentially explosive environment (for this purpose, the touch contact switches may be constructed as hermetically sealed contacts) or on a machine tool or tooling machine.

The readout circuit 28, by four terminals [A], [B], [L] and [M], is connected with an electronic feeding and analyzing system 60. The testing current $I_P$ as well as the operating current $I_B$ for the consuming device 24 are fed by a single feeding line 39C of feeder terminal [L]. Terminal [M] represents the opposite-poled low feed end at a common reference potential mass surface or ground 9. When the arrangement is used at/in a vehicle steering wheel 32, the readout part 28 fixed at the chassis and housed in the steering column, in the simplest case, must therefore only be connected with an installed offset electronic feeding and analyzing circuit 60 via three discrete lines 39A, 39B and 39C. The frame ground connection takes place via the reference potential mass 9, for which, in case of a vehicle, a metallic vehicle chassis is employed as a reference potential bar. To this extent, the connection of the arrangement in the vehicle is therefore advantageously simple.

The electronic feeding and analyzing system 60 includes two parts with different functions, specifically a control device 40 and a supply monitoring device 50. Both devices 40, 50 are supplied from the battery voltage $+U_b$ and are connected with the reference potential mass 9. Both parts more or less cooperate. They may also be integrated into one another, as, for example, in the embodiment according to FIG. 13, in an A/D micro-controller as will be described more fully hereinafter.

A reset touch contact switch 94, interacting with the electronic system of the present invention, is also provided by which a reset line RS, by means of a pull-up resistor 95, can temporarily apply the vehicle supply voltage $+U_b$ to an input of the system 60. For the debouncing of the touch contact switch 94, this line, by means of a capacitance 96, may be blocked with respect to the reference mass potential 9 and affects the control device 40 as well as the supply monitoring device 50.

Basically, the control device 40 is constructed in such a manner that it can analyze in different ways a change in the isolated circuit 29 or a reading voltage, which deviates from the no-defect testing condition without any touch contact switch actuation, as a function of how long the reading voltage lasts or whether the reading voltage is present only after a certain recognition delay time $T_{VO}$ has elapsed or whether the reading voltage already exists when the operating voltage of a gate trigger current circuit for driving the arrangement is switched on.

The control device 40 has at least three inputs, specifically a read input 41 to which the output voltage $U_{P2}$ of terminal [B] of the readout circuit 28 can be fed via the transmission line 39B; a read input 42, to which the output voltage $U_{P1}$ of terminal [A] of the readout circuit 28 can be fed via transmission line 39A; and a control input 48, to which a signal for the supplying of operating current to the consuming device 24 can be fed via the control line 49. As an example, in a motor vehicle, the appropriately processed signal of a crash sensor may be received on this line. This crash sensor has the purpose of triggering the supplying of current to a trigger dot 24 if a threshold deceleration of the vehicle is exceeded in the case of an accident.

The control device 40 contains a (preferably calibrated or regulated) alternating-current source 70a or alternating-voltage source 70b. From its output 43, the control device 40, via the feed line 39C, therefore supplies the feeder terminal [L] of the read circuit 28 with an alternating current. An internal power switch 73 which, if necessary, may be insulated against reverse voltage by diodes 71, via a switching output 44 and the output line 45, supplies current to at least one operating device 56 which is to be triggered by actuating, for example touch contact switch 38a. In a vehicle, this operating device may, for example, be the horn.

Advantageously, the control device 40 is constructed in such a manner that such a supply of current may also be controlled by a signal fed to the input 46 on the control line 47. The control line 47, in a vehicle, may be connected, for example, with the alarm output of an antibreak-in and antitheft alarm system. In the simplest case, the input 46 and the switching output 44 are directly connected with one another, preferably at least via a decoupling semiconductor element, such as a diode junction 72. However, a switching amplifier may also be provided between input 46 and switching output 44 for the external triggering of the horn 56 by means of a logic control signal of very low power.

As an option, the control device 40 has an additional output 61 which, via the control line 62, may be connected with an additional operating device which is not shown. In a motor vehicle, such an operating device may, for example, be the central locking system which is to open automatically a certain time period after the arrival of a triggering signal at input 48. However, it may also be a central electronic system with a nonvolatile diagnostic program memory that can be read out for service purposes, into which, for example, the category of an existing defective condition can be transmitted in a coded manner by the control device 40 via the control line 62 for storage.

In addition, the control device 40 also has at least one warning output 57 from which, via an indicating line 58, it can emit a defect signal $U_W$ which, in a motor vehicle, for example, activates a visual or acoustic warning device in the viewing or hearing range of the vehicle operator.

Finally, the control device 40 may also have an additional switching output 91, from which, via a line 92, at least one second operating device 93—particularly the emergency flashers of a motor vehicle—can be acted upon by a control current $I_Z$, when a corresponding touch contact switch in the isolated circuit 29 is actuated.

The supply monitoring device 50 has a measuring input 51 which is connected with the feeding line 39C in such a manner that either the testing alternating current $I_P$ or the testing alternating voltage $U_P$ on the feeding line 39C can be sensed. The simpler case of a measuring of the voltage will be illustrated hereinafter. An alarm output 52 feeds an alarm line 53 or as an alternative, an additional output 54, via a line 55, may control the operating device 56. By means of a logic linking operation performed by logic circuit 63, the indicating line 58 and the alarm line 53 are also logically combined on the trouble report line 64. This line 64 may be led to a visual or acoustic warning device in the perception range of the vehicle operator or, as with line 53, to a central electronic system with a nonvolatile diagnostic program memory which can be read out for service purposes.

In this context, line/s 64 or 58 and/or 53 may be utilized either for the transmission of a defect flag into such an external diagnostic program memory, or for implementing known mask and/or arm functions. In connection with a serial transmission of data identifying the type of an existing defect (for example, the code identifying readout voltage a defectively occupied voltage window) line 62 may be also connected to such a central system. The control device 40 and the supply monitoring device 50 are preferably integrated in a single body in a closed assembly. A corresponding integration may be implemented on the chip level.

The boosting of the alternating current to be fed into the distribution node 23 from a lower testing current level $I_P$ to an operating current level $I_B$ which suffices for the operating of the consuming device 24 (for example, for the triggering of a trigger dot 24), may take place in various ways. Either the source 70a, at a constant frequency, such as 10 kHz, can be reversed directly between two corresponding feeding conditions, for example, between a lower testing alternating current $I_P$ (from 70a) and a fixed predetermined operating alternating current (from 70b) or an at least higher operating alternating current $I_B$ (from 70a), in/to the feeder terminal [L]. Or a constant alternating voltage source 70b may essentially be provided, the frequency of which, when input 48 is controlled, is rekeyed from a different, lower/higher value (for example, from 2/16 kHz) to a different higher/lower value (for example, to 16/2 kHz). An appropriately dimensioned leakage inductance of transformers 11 and 16 may be utilized in this case in order to obtain the desired increase of the feeding current from a testing value $I_P$ to a desired operating value $I_B$, which is sufficient for starting to operate a trigger dot 24, when the feeding current frequency is boosted/lowered,.

In this context, a transformation or adaptation capacitance 98a may be connected into the current path leading from the output 43, via line 39C, feeder terminal [L], distribution node 23, primary windings 12 and 17, collector node 31, mass terminal [M] to reference potential mass 9. This transformation or matching capacitance 98a, by means of a complex resonance pole formation, causes a lowering of the current in the testing condition (inoperative state) and a raising of the current for the start of the operation of the consuming device 24 in dependence on the frequency of the feed current. According to the impedance behavior of the transformers under load and of the current or voltage source 70a or 70b, such a pole-forming matching capacitance 98a may be expedient, for example, between the collector node 31 and the mass terminal [M] or between output 43 and the tapping point of the feeding line 39C by the input 51.

The required reversing or rekeying of the source 70b may be triggered by a corresponding logic level at input 48. A similar transformation function may be achieved by a ballast reactance in the form of a burden capacitance 98b which is switched against reference potential mass 9 and which acts in parallel with the primary windings 12 and 17 and, for this purpose, is connected either at the feeder terminal [L] or at the unmarked branch-off point of line 39C in the electronic feeding and analyzing system 60.

The other characteristics of the electronic feeding and analyzing system 60 for the transmission of short-duration keying commands from the steering wheel as well as for the intense monitoring and securing of the long-term operatability, for example, of an integral horn/airbag system in a motor vehicle, will now be explained with reference to FIGS. 7 to 14. The case of the closing touch contact switch 38a will first be used as the basis.

As the result of the initially described principle of operation of the arrangement, a short-circuiting of the simulation device 25 by actuation the touch contact switch 38a causes a characteristic changing of the voltages $U_{P1}$ and $U_{P2}$ or of a differential voltage:

$$U_{AB} = (U_{P1} - U_{P2}),$$

$U_{AB}$ having the same magnitude as a differential voltage resulting from an interruption of the circuit 26 or of the consuming device 24 but having an opposite polarity. The control devices 40 analyzes the magnitude and direction of this differential voltage $U_{AB}$ to differentiate the different signals. For a clear recognition also of defects at transformers 11 and 16, an alternative or additional analyzing of the individual voltages $U_{P1}$ and $U_{P2}$ with respect to reference potential mass 9 is possible and advantageous.

FIG. 7, as an example, shows the course of the differential voltage $U_{AB}$ without and with the actuating of the closing touch contact switch 38a during two time intervals $T_{H1}$ and $T_{H2}$. Although the actual differential voltage $U_{ABo}$ is not zero when circuit parts 28 and 29 are free of defects or, without actuation of the touch contact switch 38a, as a result of unavoidable manufacturing and mounting tolerances of the transformers 11 and 16, it is at least within a permissible tolerance range $R_O$ around the zero value. Among other things, by an appropriate dimensioning and adaptation of resistances 10A and 10B to the leakage inductance of the transformers 11 and 16, the width of this range (for example, $U_O = \pm 2$ volt) can be fixed according to the desired signal-to-background ratio. For example, within this range, the differential voltage $U_{ABo}$ may fluctuate as a function of fluctuations or nominal deviations of the feeding current $I_P$, alignment errors, eccentricities and other mounting or manufacturing inaccuracies of the rotary transformers when the steering wheel is turned, as indicated during the time interval $T_{L1}$.

During the short-circuiting of the simulation device 25, by an actuating of the touch contact switch 38a, the voltage $U_{ABo}$ increases (corresponding to $U_{P1}$ by a lower amount) beyond the range limit $U_O$ (for example, +2 volt) of the voltage window $R_O$ by a predetermined mean value (for example, +5 volt) to an average value $U_{ABH}$ (for example, +5 volt) which, according to the dimensions of the read pulses $H_1$ and $H_2$, is located in the actuation read window $R_{1+}$ (for example, +3.5 to +6.5 V). When the touch contact switch 38a is actuated, the acutal differential voltage $U_{ABH}$ can and may then fluctuate within this range, for example, as a function of fluctuations or nominal deviations of the feeding current $I_P$ or alignment errors, eccentricities and other mounting or manufacturing inaccuracies of the rotary transformers, for example, during the turning of the steering wheel. The latter is indicated during the time interval $T_{L2}$. Between the voltage ranges $R_O$ and $R_{1+}$ (or $R_{1-}$), an unauthorized voltage window $E_{1+}$ (or $E_{1-}$) may be located, within which an actual differential voltage $U_{AB}$ is at least classified and analyzed as being effective. Compare description regarding FIG. 11 below.

It is an important characteristic of the arrangement that, when the primary operating current $I_B$ is supplied, the operatability of the consuming device 24, if the touch contact switch 38a is actuated accidentally, is neither prevented nor limited. When the switch 38a is activated, the power loss at the simulation device 25 which, as mentioned, is relatively low, is reduced completely to zero; i.e., all power, which is inductively transmitted into the isolated circuit 29 is usefully offered to the consuming device 24 as operating power. Relative to a use of the arrangement as a component of a horn/airbag safety system in a motor vehicle, this means that the triggerability of the airbag is not affected at all by, for example, an actuating of the horn as a result of fright.

If the corresponding touch contact switch 38a', which is shown only by an interrupted line in FIG. 6 and which short-circuits the consuming device 24 analogously during the time $T_{B1}$, is actuated as an alternative, the differential voltage $U_{AB}$, under the same conditions, according to the dimensions of the read impulse $B_1$ shown by an interrupted line, would assume a value in mirror-inverted voltage windows $R_{1-}$ or $E_{1-}$, so that two significantly different reading voltages can be assigned to two different commands by means of touch contact switches 38a and 38a'.

A differential voltage $U_{ABH}$, which exceeds (falls below) the window $R_{1+}$ ($R_{1-}$) and falls into an adjacent defect window $E_{2+}$ ($E_{2-}$), is classified and analyzed analogously as above. When the pulse tops of the read pulses $H_1$ and $H_2$ (or $H_O$) are located in windows $E_{1+}$ or $E_{2+}$ (or $E_{1-}$ or $E_{2-}$), in addition to a separate generating of a warning signal, a blocking of the operating device 56 may also be triggered in the control device 40 (possibly, in cooperation with supply monitoring device 50). Such faulty positions of the reading voltage $U_{AB}$ or its components $U_{P1}$, $U_{P2}$ may occur, for example, as a result of an unsatisfactory fit or an inexact remounting of the rotary transformer parts during a service operation, and thus can at least be recognized in a simple manner.

Since the bridge rectifiers 1 to 5 used according to the invention are operated far below their stress limits and have a high resistance to shock, the probability of their failure is low. More probable defects may be wire breaks in the readout circuit 28, for example, at connection points, or a defective short circuit or a faulty interruption of one of the two current paths 26 and 27, for example, by short-circuiting or interruption in the consuming device 24 or its simulation device 25 or its respective connections. In this case, a specific change of voltages $U_{P1}$ and $U_{P2}$ or of the differential voltage $U_{AB}=(U_{P1}-U_{P2})$ can be assigned to each type of fault so that different faults can be clearly differentiated by the classification of the measuring result in the control device 40, and can therefore be coded. During a service, the unnecessary removal of undamaged parts is therefore avoided.

According to FIG. 7, at the point in time $t_e$, a circuit breaking in the consuming device 24, for example, in the trigger dot 24 of a vehicle occupant protection system or in the simulation device 25, causes a rise $H_3$ or fall $H_4$ of the reading voltage $U_{AB}$ to a limit potential $U_{G+}$ or $U_{G-}$, which is located at least in the defect voltage window $E_{2+}$ or $E_{2-}$, preferably even in a special range $E_{3+}$ or $E_{3-}$ adjacent the outside of window $E_{2+}$ ($E_{2-}$). This significant increase of the signal voltage occurs because the primary windings 12 and 17, with respect to the overall voltage feeding them in series, form a voltage divider, in which case, the larger part of the overall voltage occurs at that primary winding, the associated secondary winding being subjected to a lower load. A correspondingly higher voltage will then also occur at the assigned read winding 14 or 19.

The limiting to level $U_{G+}$ or $U_{G-}$ is preferably caused by a limiting device at inputs 41 and 42 of the control device, which is not shown in the figures. Such a limiting device is expedient in order to at least avoid a damaging of the corresponding input circuits of the control device 40 when the consuming device 24 is operated (feeding of the operating current $I_B$ into the primary windings). The criterion that the voltage $U_{AB}$ passes through the defect voltage window $E_{2+}$ or $E_{2-}$ or remains stationary on the limit potential $U_{G+}$ or $U_{G-}$, is discriminated in the control device 40 and processed into a corresponding warning signal which is emitted.

If, in contrast, an circuit breaking touch contact switch 38c is provided in series with the simulation device 25, the reading voltage $U_{AB}$, in the absence of a fault, when the touch contact switch 38c is actuated, assumes the limit value $U_{G-}$. Correspondingly, the voltage $U_{AB}$ would reach the limit value $U_{G+}$, if a circuit breaking touch contact switch 38c' were actuated which is located in series with the consuming device 24. In this regard, a circuit breaking touch contact switch 38c, which, therefore has a complementary action with respect to short circuiting switch 38a, can definitely perform the triggering of an operating device from the isolated circuit 29; particularly if this operating device is to be operated for only a short time period. In the control device 40, a clear differentiation can then be made between an only short-time reaching of the limit potential $U_{G+}$ or $U_{G-}$ (operation) and a stationary remaining of the reading voltage $U_{AB}$ on this value (defect).

Additionally, this type of a touch contact switch may be used for testing the proper overall behavior of the arrangement as will be described hereinafter.

Since the above-mentioned possibilities of the triggering of at least one operating device from the isolated circuit 29 are based on a pure direct-voltage analysis of voltages $U_{P1}$ and/or $U_{P2}$, they can be utilized particularly advantageously when the readout circuit 28 and the electronic feeding and analyzing system 60 are to be housed at a large distance from one another, and a high suppression of interfering signals which electrostatically or inductively stray on lines 39A to 39C is to be achieved also without any shielding of these lines. Such a suppression is easily achieved, in that block-off capacitors 30D and 30E can be connected to inputs 41 and 42 of the control device 40 and, in a defined manner, amplify the unavoidable wiring capacitances 30A and 30B with respect to the reference potential mass 9. As a result, not only the wiring capacitance 59 related AC coupling effect of the feeding line 39C on reading lines 39A and 39B is reduced, but also corresponding external pick-ups, such as inductive switching peaks, etc. are leaked to reference potential mass 9.

If an application permits the housing of the read circuit 29 and of the electronic feeding and analyzing system 60 at a short distance from one another, the wiring capacitances 30A, 30B and 59 will be low. In addition, correspondingly short lines 39A to 39C offer much smaller induction flux areas to inductive interference influences for the buildup of interfering alternating voltages which may, in an interfering manner, be superimposed on the reading voltage which can be utilized for the analysis.

In this case, the arrangement according to the invention can be utilized even more efficiently because of the fact that the resistances 10A and 10B, in relation to unavoidable wiring capacitances 30A, 30B, 59, are constructed to be of a sufficiently low impedance that the signal voltages $U_{P1}$ and/or $U_{P2}$, with respect to their alternating-voltage components or even with respect to the direct voltage and alternating-voltage components, can be analyzed simultaneously. As a result, defects of the bridge rectifiers 1 to 5 as well as of the two transformers 11 and 16 can be diagnosed particularly easily.

Figure 8:
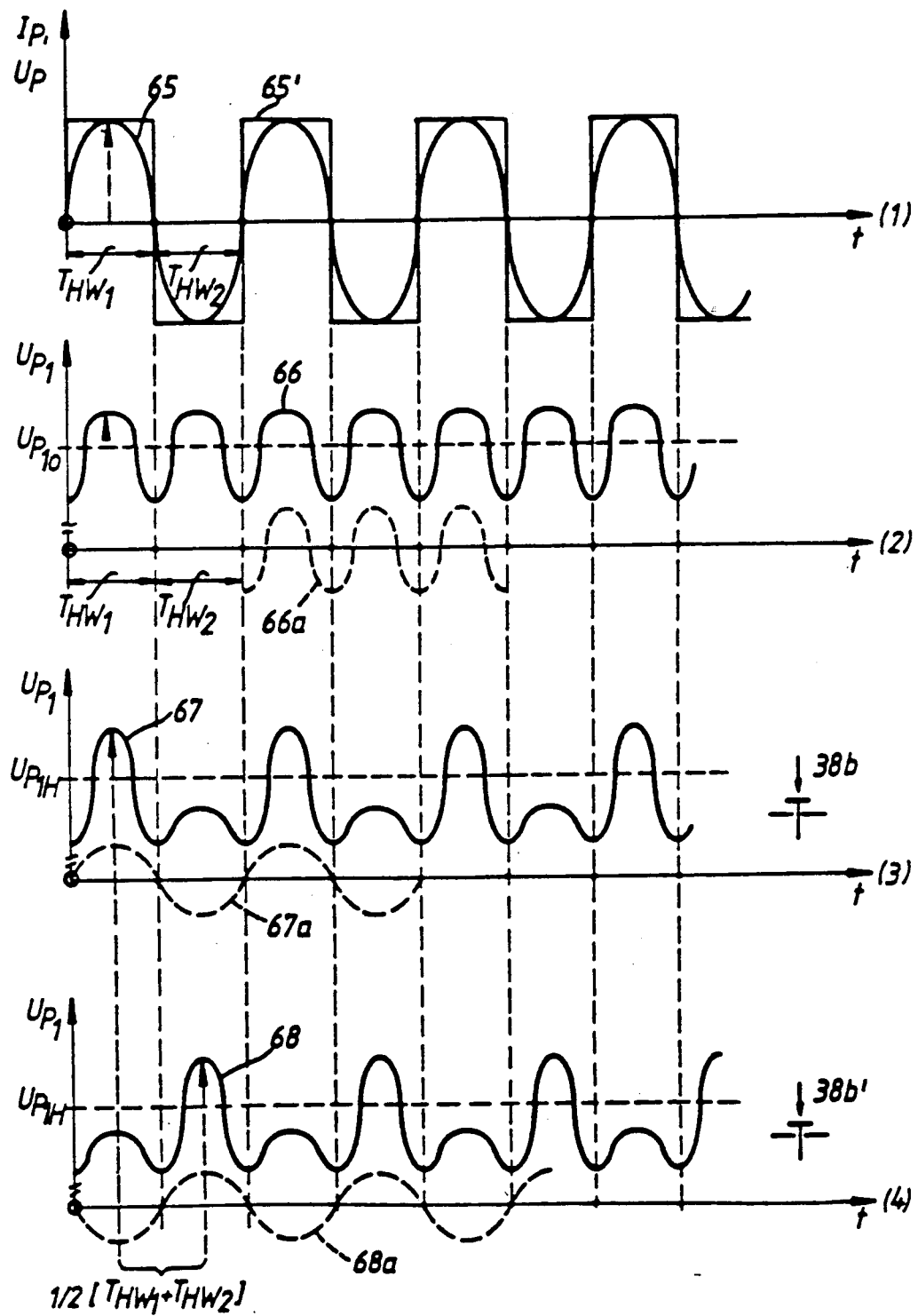
FIGS. 8-(1) to 8-(4) are waveform diagrams illustrating variations with respect to time of the reading voltage $U_{P1}$ due to various triggering or defect conditions.

This is demonstrated in FIG. 8 by the example of a closing, short circuiting touch contact switch 38b or 38b', which bridges the secondary winding 18 or 13 and thus causes the same effect as, for example, a short-circuiting between the lines or starting turns of one of the windings of both transformers.

FIG. 8-(1) shows the variation in time of waveforms 65 or 65' of the driving primary test current $I_P$ or of the primary voltage $U_P$. FIG. 8-(2) shows the principal course of the voltage $U_{P1}$ in the absence of a defect and when the touch contact switch 38b is not actuated. FIG. 8-(3) shows the corresponding course of the voltage $U_{P1}$ when the touch contact switch 38b is actuated, and FIG. 8-(4) shows the course of the voltage $U_{P1}$ when touch contact switch 38b' is actuated correspondingly. A certain constant phase shifting between the cause and effect signal is not taken into account because it does not affect the understanding. As an example, the reading voltage $U_{P1}$ relates to the approximately sinusoidal variation of the waveform 65 in time. In the same manner, the arrangement is also to be operated in the case of a rectangular variation of the waveform 65' in time.

When no defect is present and the touch contact switch 38b or 38b' is not actuated, the variation in time of waveform 66 of the reading voltage $U_{P1}$ shown in FIG. 8-(2) has a direct-voltage means value $U_{P10}$ component and an alternating voltage component 66a which has twice the base frequency of the operating voltage $U_P$. The base frequency of the operating voltage $U_P$ is therefore suppressed in the measuring result $U_{P1}$.

When the touch contact switch 38b is actuated, or if a short circuit exists in at least one of the windings of the transformer 16, the variation in time of the reading voltage $U_{P1}$, according to FIG. 8-(3), assumes shape 67. It is distinguished by the fact that, in addition to harmonic waves, it contains the ground wave component 67a with the frequency of the driving voltage $U_P$, in which case, this ground wave component 67a, in addition, has a first predetermined phase relation with respect to the waveform cycle 65 of the operating voltage $U_P$ (as an example, an inphase condition is indicated). While, in time interval $T_{HW1}$, the amplitude of the alternating-voltage part seems enlarged (possibly up to threshold clamping by valves 4/1 to 4/4 and 5/1 to 5/4), this amplitude seems to be reduced in time interval $T_{HW2}$.

According to FIG. 8-(4), the precisely reversed conditions would occur, if a corresponding touch contact switch 38b' were actuated, or a corresponding short circuit existed in one of the windings of the transformer 11. It is shown that the corresponding ground wave component 68a of the resulting waveform 68 of the reading voltage, with respect to the waveform cycle 65 of the feeding voltage $U_P$ or with respect to the waveform cycle 66 of the reading voltage $U_{P1}$, has a second predetermined phase relation which differs from the first one in phase by an offsetting of time of about ½ $(T_{HW1}+T_{HW2})$, i.e. by half the period of the driving frequency. This significant phase offsetting can be easily analyzed, in that the time shifting of the occurrence of, for example, an arbitrary momentary value is sensed and compared (characterized, for example, by the tip of an arrow shown in the Figure) with respect to the phase relation of the driving quantity $U_P$ or $I_P$.

The discrimination of certain minimum ground wave components in the read signal therefore permits either the monitoring and recognition of the actuation of a touch contact switch in the isolated circuit or the recognition of a defect of a component in the circuit parts 28 and 29.

The additional sensing of the phase relation of the ground wave part of the reading voltage with respect to the feeding current or with respect to the feeding voltage, in addition, makes it possible to obtain information on whether, for example, a short circuit exists at the consuming device 24 or at the simulation device 25 or at the transformer 11 or 16. Further, by a corresponding phase discrimination, instead of one, two different operating devices 56 and 93 may just as easily be actuated by the isolated circuit as an alternative.

An additional analyzing of the direct-voltage mean value of the reading voltage also permits an even more reliable self-monitoring function of the operational status of the arrangement in the standby operation in the manner of a continuous testing operation.

For this purpose, FIG. 9 shows a block diagram excerpt from a control device 40 which, among others, permits this above-noted self-monitoring function. The reading voltage $U_{P1}$ or a voltage $U_{AB}$, derived from the differential voltage $U_{AB}$ is applied at the input of a filter 73, which has a direct-voltage blocking capacitor 74, a filter element 75 with a low-pass 76 or band pass characteristic 77 and, if necessary, an isolating or adapting amplifier 78. The filter element 75 is used not only for the relative suppression of the reading voltage harmonic components of a double or higher frequency, but also causes, for example, for the purpose of an optimal phase discrimination, an optimal basic phase shifting of the unsuppressed ground wave component of the sensed waveform with respect to the driving voltage $U_P$.

In the case of a digitally implemented band pass filter 77, its reference control may be provided on a path 70c from the feeding source 70a or 70b. The output of filter 73 is connected to the first input 79 of a synchronous scanning or phase detector circuit 80, at the second input 81 of which, a reference signal of the basic frequency of the driving supply is applied which is derived from the alternating-current or alternating-voltage source 70a or 70b applied to the feeder terminal (L).

This synchronous scanning or phase detector circuit 80 may, for example, be an arrangement which links a logic gate function with a delay time, which can be represented by a time function element. It may also be implemented by several flip-flop circuits. Its main component may also be formed by a balanced modulator or a phase-locked control loop (PLL).

The synchronous scanning or phase detector circuit 80 preferably has two outputs 82 and 83. Output 82 emits a specific signal $U_{Lock}$, if, as a result of a sufficient ground wave content of the reading voltage $U_{P1}$ or $U_{AB'}$, a synchronous detection of the alternating-voltage component of the ground wave with the driving supply feeding quantity ("locked", "lock in") is possible. Output 83 emits a status signal which, in each case, corresponds to one or the other relative phase relation between the feeding quantity at output 43 and the ground wave filtered out of the reading voltage (switch 38b or 38b' closed).

As a further component of the control device 40, a testing circuit 90 is indicated which is partly connected in parallel with and partly downstream of the above-mentioned arrangement. Preferably, it classifies the direct-voltage component of the reading voltage $U_{Pl}$ or $U_{AB}$ according to the mentioned voltage windows; for example, by using a window comparator 84 to which a reference voltage $U_{ref}$ may be fed. If this direct-voltage component falls into one of the mentioned defect voltage windows, the testing circuit 90 will emit a corresponding signal via a line 89. Test circuit 90 is also connected with the first input 85 of a logic linking circuit component 86, the second input 87 of which is in operative connection with output 82 of the synchronous scanning or phase detector circuit 80.

Outputs 82, 83, 88 and 89, by means of a logic connected with them, but not indicated here in detail, acts upon the described outputs of the control device 40. By means of such a component as the logic linking circuit 86 of the control device 40, the coincidence of a certain mean direct-voltage component valve of the read signal with its present or absent synchronous phase detectability can be analyzed. By an arrangement constructed in this manner, the warning and control signals of outputs 61 and 57 of the control device 40, which can be emitted on lines 58, 62 and 64, can be plausibly obtained, resulting in an easy monitorability of the circuit arrangement as well as a high inherent reliability against a malfunctioning of the arrangement.

Additionally, by means of a touch contact switch 38a, the operating device 56 can be triggered only as a result of a certain direct-voltage component value of the reading voltage within a predetermined read window, whereas, by means of another touch contact switch 38, for example, another operating device 93 can be triggered as a result of a nonconformity of the resulting direct-voltage component of the reading voltage with the above-mentioned read window, while it is possible at the same time, however to synchronously detect a ground wave component of the driving quantity.

Correspondingly, the logic linking circuit 86 can also ensure that two operating devices are not triggered by one and the same touch contact switch. Since the actuating of the touch contact switches 38c and 38c' leaves the ground wave suppression in the reading voltage essentially unchanged, the thus constructed arrangement according to the embodiment, in principle, results in several possibilities for the mutually independent actuating or triggering formats of an operating device from the isolated circuit, as more fully described hereinafter.

A touch contact switch 38d may be provided (in addition) which closes, when actuated, and short-circuits the two secondary windings 13 and 18 connected in series, in order to be used for triggering and testing purposes. For the latter, it may, for example, be mounted at a steering wheel such that it can be actuated only by a servicing tool, such as a test prod.

In the case of an absence or a continuous breakdown of the driving voltage $U_P$ at the feeder terminal [L] as early as during or after the connecting of the operating voltage of the ignition enabling circuit, it is very probable that a defect exists, such as a short circuit in circuit parts 28 and 29 or a failure of the control device 40.

If the feeding source of the control device 40 is constructed as an alternating-current source 70a, the supply monitoring device 50 will determine a faulty breakdown of the output voltage $U_P$ applied at the feeder terminal [L] below a permissible valve, and emits a warning or actuating signal at its output 52. If the feeding source is constructed as an alternating-voltage source 70b, the supply monitoring device 50, for example, also monitors the testing current $I_P$ flowing in line 39C.

1) As a function of whether such a breakdown occurs at the time of or immediately after the switching on of the operating voltage (of the ignition enabling circuit) of the feed source or not before the expiration of an initial recognition delay time $T_{VO}$; and/or 2) as a function of the general duration of such a breakdown; and 3) as a function of whether the vehicle operator has actually noticed a warning signal issued to him and acknowledges it (operator-guided confirmation of the perception of an alarm/warning condition), the supply monitoring device 50 may have different reactions. In this context, the above-mentioned touch contact switch 94 is provided which can be operated by the vehicle operator. The same also applies, instead of to a total breakdown, to a mere exceeding of certain limit values for $U_P$ or $I_P$ which define, for example, a permissible value range $R_P$ for these quantities.

For this purpose, the supply monitoring device 50 has at least one time discriminator for the interpretation of the duration of a deviation of quantity $U_P$ or $I_P$ from a permissible value range $R_P$. Under the condition that, at the point in time $t_O$ of the switching on of the operating voltage (of the ignition enabling circuit) of the feed source, no defect exists and the amount $U_P$ or $I_P$ is therefore in the permissible value range $R_P$, after an elapsing of an initial recognition delay time $T_{VO}$, the actuating of a touch contact switch 38d, for example, from output 54 via line 55 may trigger the operating device 56. For the testing of an alarm function, a testing (warning) signal may just as easily be emitted at output 52.

The supply monitoring device 50 may, in addition, be constructed in such a manner that, when it recognizes a defined deviation, twice or several times in a short succession, outside the mentioned permissible $R_P$ range of quantity $U_P$ or $I_P$, the mentioned delay time $T_{VO}$ is cancelled. When, for example, a touch contact switch 38d is actuated in this repetitive manner as the testing switch in the steering wheel of a vehicle, it may, in addition, test the function of the operating device 56—for example, of the horn—immediately (i.e., without waiting for an initial recognition delay time $T_{VO}$), specifically independently of the control device 40. Therefore, if, for example, when the touch contact switch 38a was previously actuated—i.e., during an attempt of a regular triggering of the control device 40—no functioning of the horn could be achieved, the horn 56 or its supply line 45 is most probably defective if it also does not function when the testing touch contact switch 38d is actuated. This type of a defect can be indicated correspondingly.

Figure 10:
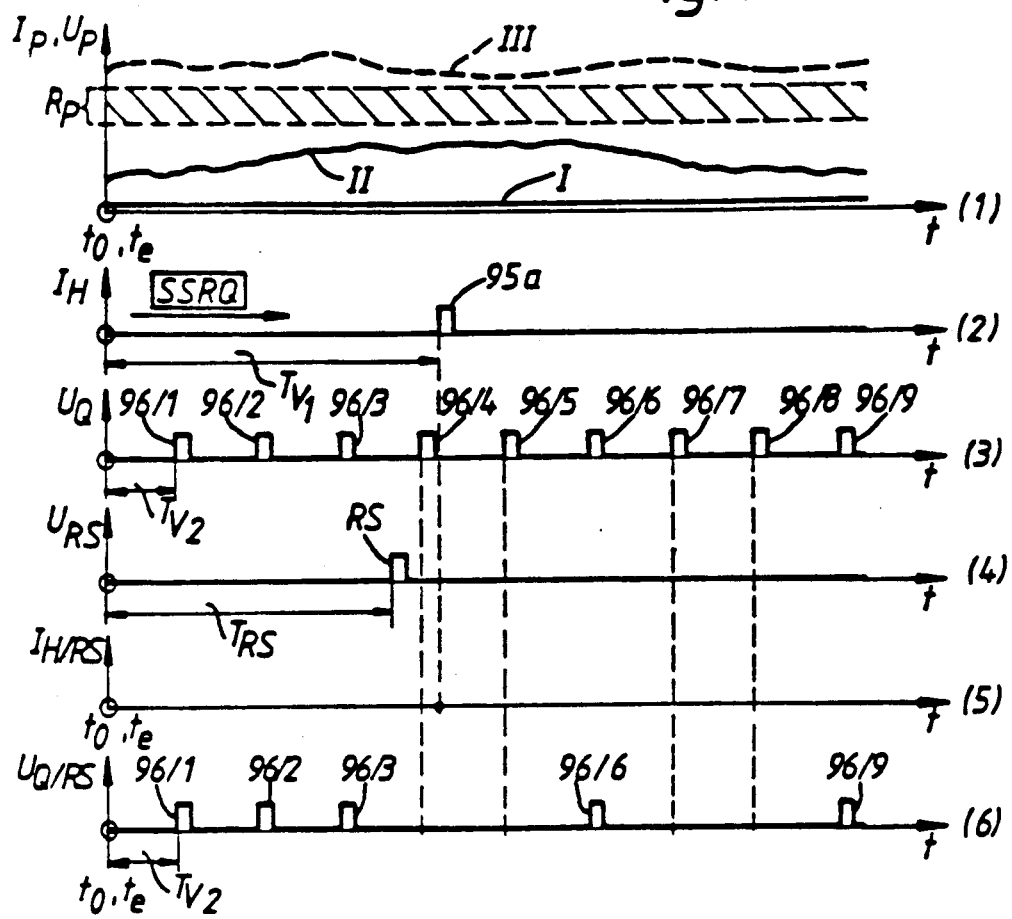
FIGS. 10-(1) to 10-(6) are waveform diagrams illustrating various forms of a defect warning/alarm signal.

FIG. 10 shows the operation of the supply monitoring device 50 when a defect of any type occurs which for $U_P$ or $I_P$ results in impermissible values outside the permissible window $R_P$. In this case, in particular, also the failure of the feeding source 70a or 70b of the control device 40 is sensed because this failure will inevitably result in a reading voltage $U_{AB}=0$ within the permissible reading voltage range $R_O$, and thus, under certain circumstances can be analyzed only to a limited extent by other testing circuits of the control device 40 alone.

FIG. 10-(1) shows the value window $R_P$, inside which the feeding quantity $U_P$ or $I_P$ is normally located, and, in addition, faulty variations in time of $U_P$ or $I_P$, in the case of a presence of a short circuit or a defect of the feeding source 70a or 70b (I) or a faulty drop (II) or a faulty excessive rising (III) of the feeding quantity. The point in time $t_O$, in this case, corresponds to that of the switching on of the operating voltage of the ignition enabling current circuit of the feed source and thus, as indicated in FIG. 10-(1), illustrates the situation where $U_P$ or $I_P$ are already outside the permissible value range $R_P$ at start up. In contrast, $t_e$ symbolizes any arbitrary point in time in which, for example, after the preceding expiration of the above-mentioned recognition delay time $T_{VO}$, which is not shown here, the recognition of a defect takes place in response to a defect, instead of in response to the actuation of a touch contact switch 38d. $t_O$ and $t_e$ therefore each indicate the start of a service request (Start Service request, SSRQ condition).

FIG. 10-(2) shows the course of the actuating current $I_H$ of the operating device 56. After the delay period $T_{V1}$, the output 54 emits a one-time short current pulse 95a, for example, to the horn as the operating device 56, causing the horn to sound briefly without any intentional influence by the vehicle operator. This (intensive) warning signal is very noticeable and the vehicle operator can therefore hardly miss it. The forced triggering of, for example, the horn, however, is provided only for an "extreme alarm emission" which is in fact triggered only in the case of an extraordinary delay in perception by the vehicle operator. This is ensured as described below.

According to FIG. 10-(3), after a defect condition is recognized in the point in time $t_O$ or $t_e$, the output 52, via line 53 or alarm line 64, emits the alarm voltage $U_Q$ to a visual and/or acoustic signal generator in the perception field of the vehicle operator, this alarm voltage $U_Q$ consisting of short pulses 96/1, . . . 96/9, . . . with a sequential time spacing $T_{V2}$, in which case, the latter is significantly shorter than the delay time $T_{V1}$. The event of the pulse 95a is therefore preceded by a large number of warning signals which, for example, can be perceived visually and/or acoustically from the instrument panel of the vehicle.

In the shown case, these are four warning signals corresponding to the four voltage pulses 96/1 to 96/4. The repetitive warning signals 96/1–96/4 may be emitted in a perception-linked manner with an operating instruction to the vehicle operator, which may possibly light up in a corresponding pulse-like manner, to command the operator to acknowledge the alarm by actuating a reset key 94. A corresponding instruction may also take place by a voice output of a central vehicle management system controlled by the arrangement. In any case, the multiple repetition gives the vehicle operator sufficient time to become aware of the presence of a defect before the pulse 95a is triggered, in order to finally point the defect out to him in a particularly clear manner.

According to FIG. 10-(4), as a result of the actuating of the reset key 94, a RS-pulse, as the reset voltage $U_{RS}$, is applied to the "RS" line of the supply monitoring device 50.

When, after a certain perception time $T_{RS}$, the vehicle operator acknowledges the indicated defect condition, the RS pulse fed into the supply monitoring device 50 has two effects. First, pulse 95a according to FIG. 10-(5) is extracted or suppressed; i.e., the extreme alarm emission by the operating device 56 is prevented. Secondly, according to FIG. 10-(6), after generating the RS-pulse as the perception acknowledgement of the vehicle operator, the rate of the visual and/or acoustic alarm signals derived from the alarm voltage $U_Q$ is slowed, in that, for example, in a respective repetitive manner, a certain number of successive pulses (in the example, 96/4 and 96/5, 96/7 and 96/8) are deleted. After the defect condition is acknowledged by the vehicle operator, the generated warning signal therefore corresponds to the course of time-scattered pulses 96/6, 96/9, . . . .

The slowing of the rate of the warning signal is provided after the vehicle operator has acknowledged the perceiving of a defect condition in order to still remind the operator sufficiently of the presence of a defect, but to divert his attention not more than necessary from the traffic situation. This more or less latent reporting condition can be reset and thus terminated only by the switching-off of the power supply ignition enabling current circuit. In this manner, the vehicle operator may be kept informed that the horn of the vehicle cannot be triggered under certain circumstances, or that, in the case of an accident, an occupant protection device, such as an airbag in the steering wheel, which is to be operated by the consuming device 24, may, under certain circumstances, not be operable.

Preferably, it is provided that a slowing of the rate of the warning signal will no longer be possible if the vehicle operator has neglected to actuate the reset key 94 before the occurrence of the automatic triggering of the operating device 56 by the current pulse 95a. The pre-existing condition, in which, by the prompt actuating of the reset key 94, the impulse 95a can be suppressed and the warning signal rate can be slowed according to FIG. 10-(6), can then be restored only by the switching-off and the switching-back-on of the operating voltage (gate trigger current circuit).

Figure 11:
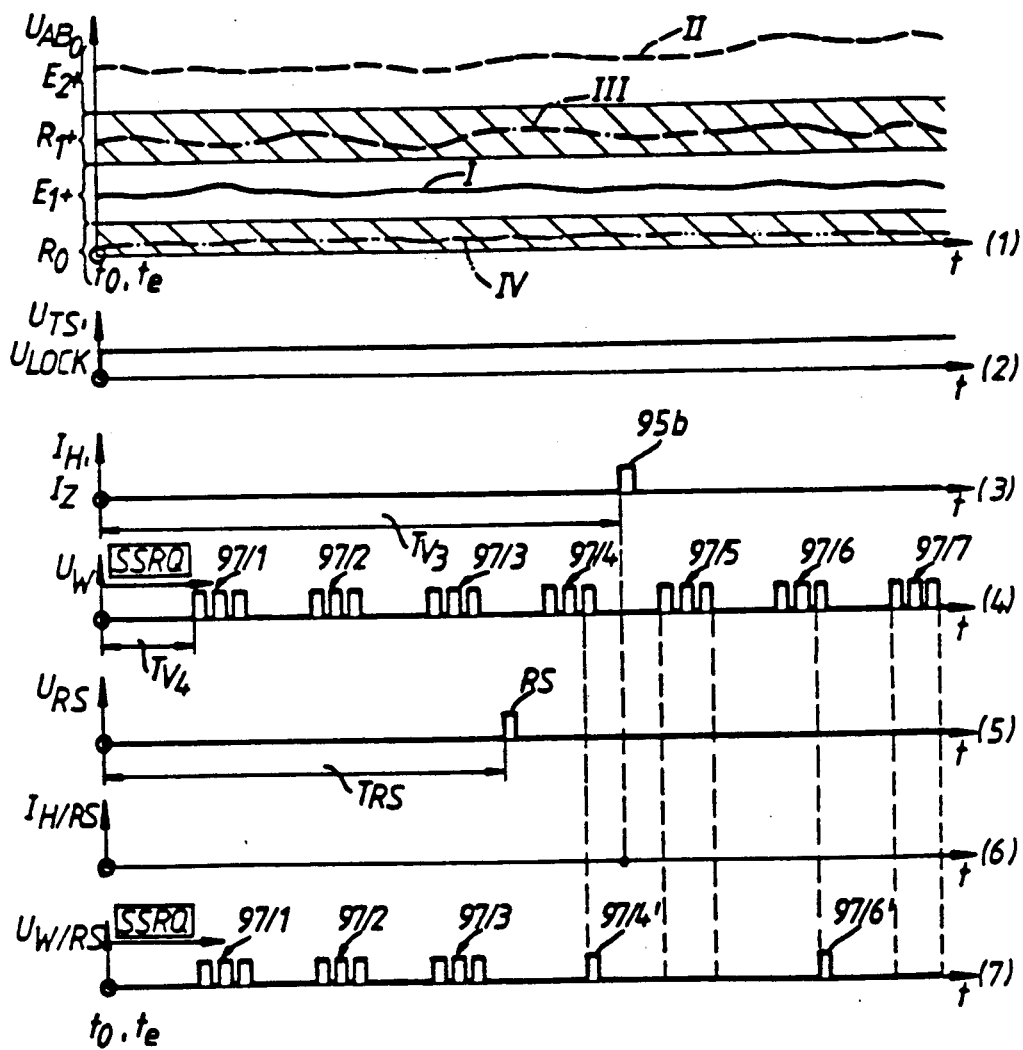
FIGS. 11-(1) to 11-(6) are waveform diagrams illustrating various forms of a defect warning/alarm signal.

By means of an example of the runtime performance of the arrangement, FIG. 11 shows other characteristics of the control device 40 analogously. In this respect the execution of an occurred SSRQ-condition is shown. The above-mentioned information applies to points in time $t_O$ and $t_e$.

FIG. 11-(1) shows different courses of the reading voltage $U_{ABo}$ without the actuating of any touch contact switch, specifically continuously in impermissible defect windows $E_{1+}$ and $E_{2+}$ (I, II), or continuously in permissible read windows $R_O$ and $R_{1+}$ (III, IV). Case IV is special because it may concern, according to FIG. 7, the no-defect testing condition without the actuating of any touch contact switch as well as a defective condition, specifically that of a short circuit in the path to the feeder terminal [L] or the failure of the feeding source 70a or 70b of the control device 40. However, as mentioned above, it is exactly this defect condition which is recognized and analyzed by the supply monitoring device 50 and therefore will not be described further in this example.

FIG. 11-(2) correspondingly shows the output signal $U_{Lock}$ at output 82 or a phase signal $U_{TS}$ at output 83 of a synchronous scanning or phase detector circuit 80 according to FIG. 9, as it can be processed from a sufficient ground wave component in the read signal, for example, in the case of a short-circuiting of the touch contact switch 38b (or 38b'). The external, continuously faulty reading direct voltage $U_{AB}$ as well as the internal voltage $U_{Lock}$ or $U_{TS}$ which is faulty because of the continuation, in principle, are analyzed identically in the control device 40 as described hereinafter.

FIG. 11-(3) shows the course of the actuating current $I_H$ of the operating device 56. The switching output 44 (91) of the control device 40, after the delay time $T_{V3}$, emits a one-time short current pulse 95b, for example, to the horn as the operating device, causing this horn to sound briefly without being intentionally influenced by the vehicle operator. In this case also, the forced triggering of, for example, the horn is provided only for an extreme alarm emission, which is triggered only if there is an usual delay in perception on the part of the vehicle operator:

According to FIG. 11-(4), after a defect condition was recognized in the point in time $t_O$ or $t_e$, the output 57, via line 58 or alarm line 64, emits the alarm voltage $U_W$ to a visual and/or acoustic signal generator in the perception range of the vehicle operator which, for example, has the variation in time of a pulse burst, which consists of the individual pulse groups 97/1, ... 97/9, ... with a sequential time $T_{V4}$, the latter being also significantly shorter than the delay time $T_{V3}$. Because the variation in time of the alarm voltage $U_W$ differs from the variation in time of $U_Q$ (FIG. 10), defect conditions according to FIG. 11-(1), before the reset key 94 is actuated, can be differentiated clearly from those according to FIG. 10-(1).

Thus, before the event of pulse 95b, a large number of visually and/or acoustically perceptible warning signals occur; in this case, for example, four warning signals corresponding to four pulse bursts 97/1 to 97/4, of which each consists of three individual pulses respectively. The repetitive warning signals may be emitted in a perception-linked manner with an operating instruction, which possibly flashes in a corresponding pulse fashion, to the vehicle operator to command the operator to acknowledge the alarm by actuating a reset key 94. In this case, a corresponding instruction may also be given by a voice output of a central vehicle management system controlled by the arrangement. In this case also, the multiple repetition allows the vehicle operator sufficient time in order to become aware of the presence of a defect before pulse 95b is triggered in order to finally point this defect out to him in a particularly urgent manner.

According to FIG. 11-(5), by the actuating of the reset key 94, an RS-pulse, as the reset voltage $U_{RS}$, is applied to line "RS" of the control device 40.

If the acknowledging of the indicated defect condition by the vehicle operator takes place after a certain operator comprehension time period $T_{RS}$ but before the expiring of time $T_{V3}$, the RS-pulse fed into the control device 40 has two effects. First, according to FIG. 11-(6), pulse 95b is deleted or suppressed; i.e., the extreme alarm emission is prevented by the operating device 56. Secondly, according to FIG. 11-(7), after the generating of the RS-pulse as the perception acknowledgement of the vehicle operator, the visual and/or acoustic alarm signals derived from the alarm voltage $U_W$ are thinned out. For this purpose, in a repetitive manner, a certain number of respective successive bursts (for example, 97/4 and 97/5, 97/7 and 97/8) are suppressed completely. For this purpose, in each case, several pulses may be extracted from unsuppressed bursts so that, for example, widely scattered with respect to time, only individual pulses 97/4', 97/6', ... from originally provided bursts 97/4, 97/6, ... may be indicated as the alarm voltage $U_{W/RS}$.

A corresponding warning signal may therefore, after the actuating of the reset key 94, appear in a similar or identical manner as the corresponding warning signal on the basis of the alarm voltage $U_{Q/RS}$ according to FIG. 10-(6). Here also, the thinning-out of the alarm takes place so that the vehicle operator, after he has noticed a defect condition, is still sufficiently reminded of the presence of a defect, but is attention is not diverted more than necessary from the traffic situation. The reporting condition which, after the actuating of key 94, is more or less latent, may be reset and therefore cancelled by the switching-off of the ignition enabling current circuit.

Here also, it may be provided that a thinning-out of the warning signal will no longer be possible if the vehicle operator has neglected to actuate the reset key 94 before the occurrence of the automatic triggering of the operating device 56 by the pulse 95b. Only by the switching-off and switching-back-on of the operating voltage (of the gate trigger current circuit) can the preexisting condition be restored in which the pulse 95b can be suppressed and the warning signal according to FIG. 11-(7) can be thinned out by the prompt actuating of the reset key 94.

At least switching outputs 44 and 54 may be current-monitored with the result that, in the case of an impossibility of a sufficient current flow $I_H$ and thus an elimination of current pulses 95a or 95b, for example, as a result of a defect in the operating device 56, its reference potential mass connection 9, or its control line 45 or 55, the thinning-out of the alarm is inhibited or reversed despite the actuating of the reset key 94. In this manner, an impossibility of the one-time extreme alarm emission, for example, by a horn, is compensated by maintaining the intensity of a visual or acoustic warning signal in the direct perception range of the vehicle operator, and servicing personnel, at the same time, will be informed of a circuit defect.

Figure 12:
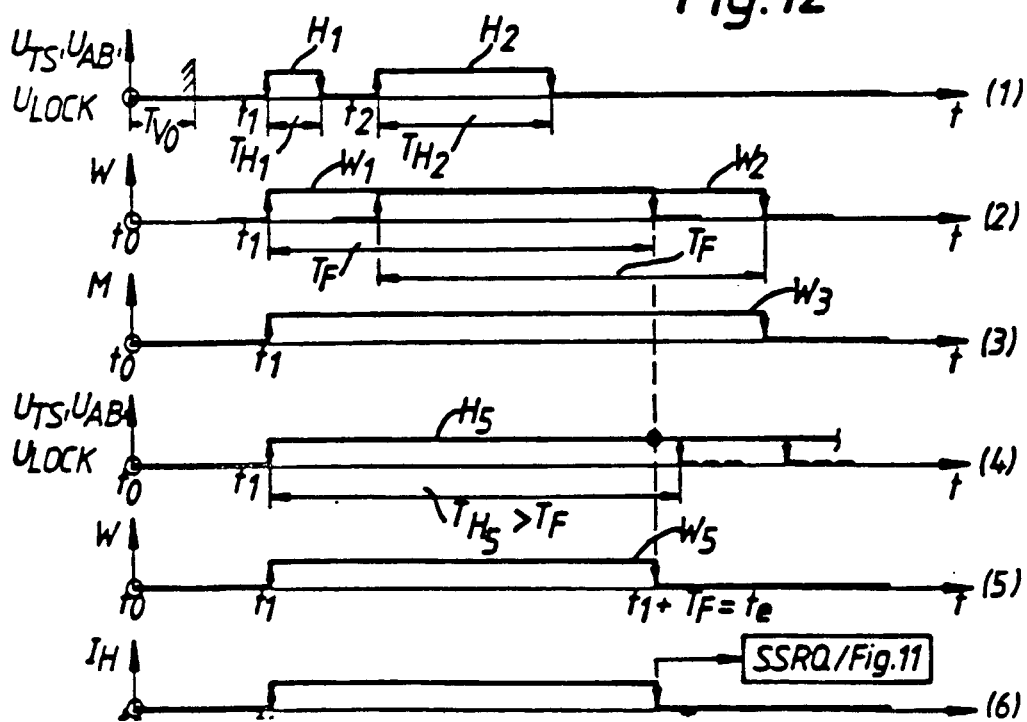
FIGS. 12-(1) to 12-(6) are waveform diagrams of a time masking extraction and alarm processing of an actuating signal which is generated erroneously by a defect.

FIG. 12 shows additional characteristics of the electronic feeding and monitoring system 60 when a defect occurs which simulates the actuating of a provided touch contact switch for the triggering of an operating device 56, such as the horn or the emergency flasher system, thus, for example, a short circuit of the touch contact key 38a.

FIG. 12-(1) shows the course of the reading direct voltage $U_{AB}$ (for example, when the touch contact switch 38a is actuated) or one of the two output voltages of the synchronous scanning or phase detector circuit 80 (for example, when a touch contact key 38b is actuated) in the form of two pulses $H_1$ and $H_2$ starting at points in time $t_1$ and $t_2$. It is assumed that, at time $t_1$, the recognition delay time $T_{VO}$, which was in effect after the switching-on of the operating voltage, has expired. As mentioned, a signal voltage already existing within time interval $T_{VO}$ would be analyzed immediately as a defect condition before point in time $t_1$.

According to FIG. 12-(2), the rising edge of the actuating pulse $H_1$ sets a time window $W_1$ of duration $T_F$, and the rising edge of the actuating pulse $H_2$ sets another time window $W_2$ also of duration $T_F$; duration $T_f$ is larger than pulse durations $T_{H1}$ and $T_{H2}$, and the command emission corresponding to pulse $H_1$ is at least concluded within time window $W_1$.

According to FIG. 12-(3), by means of logic linking, the time windows $W_1$, $W_2$, are cumulated to a contiguous time mask $W_3$, which may be implemented, for example, by the retriggering of a monostable retriggerable trigger circuit with a triggering duration $T_F$ by the rising edge of the following pulse $H_2$. Each subsequent actuation which is concluded before the expiration of time $T_F$, prolongs the time mask $W_3$ by the duration $T_F$. Arbitrary actuatings within the time mask $W_3$ which therefore builds up by itself, are recognized as regular command emissions and not as defect conditions. If the standard time duration $T_F$ is, for example, six seconds, the horn can be triggered continuously for up to six seconds and subsequently again and again continuously for up to six seconds.

If, according to FIG. 12-(4), the duration $T_{H5}$ of a single actuating read pulse $H_5$ is, however, larger than the time window $T_F$, according to FIG. 12-(5), an analog window function $W_5$ of duration $T_F$ becomes operative which limits the maximum actuating time, for example, of the horn by switching off the actuating current $I_H$ after the expiration of the duration of the time window $W_5$ to the duration $T_F$. Compare FIG. 12-(6).

In addition, according to FIG. 12-(6), an actuating reading pulse $H_5$, which is limited with respect to time in this manner, triggers the SSRQ-condition which will then be executed according to FIG. 11. To this extent, the electronic analyzing system 60 therefore assumes that, for example, the vehicle operator, in a normal case, does not continuously trigger the corresponding operating device any longer than for duration $T_F$, in this case, for example, for six seconds. If the vehicle operator has actuated the horn key for longer than six seconds and has thus triggered the SSRQ-function according to FIG. 11, in the absence of a defect, the normal operation of the horn will return automatically after the ignition enabling current is switched back on.

Not affected by such a time limitation of the triggerability of the operating device based on the driver's operation of a switch is an arbitrarily long triggering of the same operating device by a corresponding acting of the input 46 from the outside, for example, from the alarm output of an antibreak-in and antitheft alarm system in a vehicle which is connected to line 47.

By the above-mentioned functions, for example, a vehicle operator can be gently forced to take his vehicle to a repair shop, whereby, for example, the chances can be minimized that it is not recognized that an airbag-horn system may possibly no longer perfectly carry out an occupant protection function. The maintenance of an operationally safe condition, in this manner, is achieved with a high statistical certainty. The certainty of being serviced which, in this manner, is added to the high inherent reliability of the arrangement according to the invention, results in cost advantages, for example, with respect to the expenditures to be provided for a continuous operating warranty.

Figure 13:
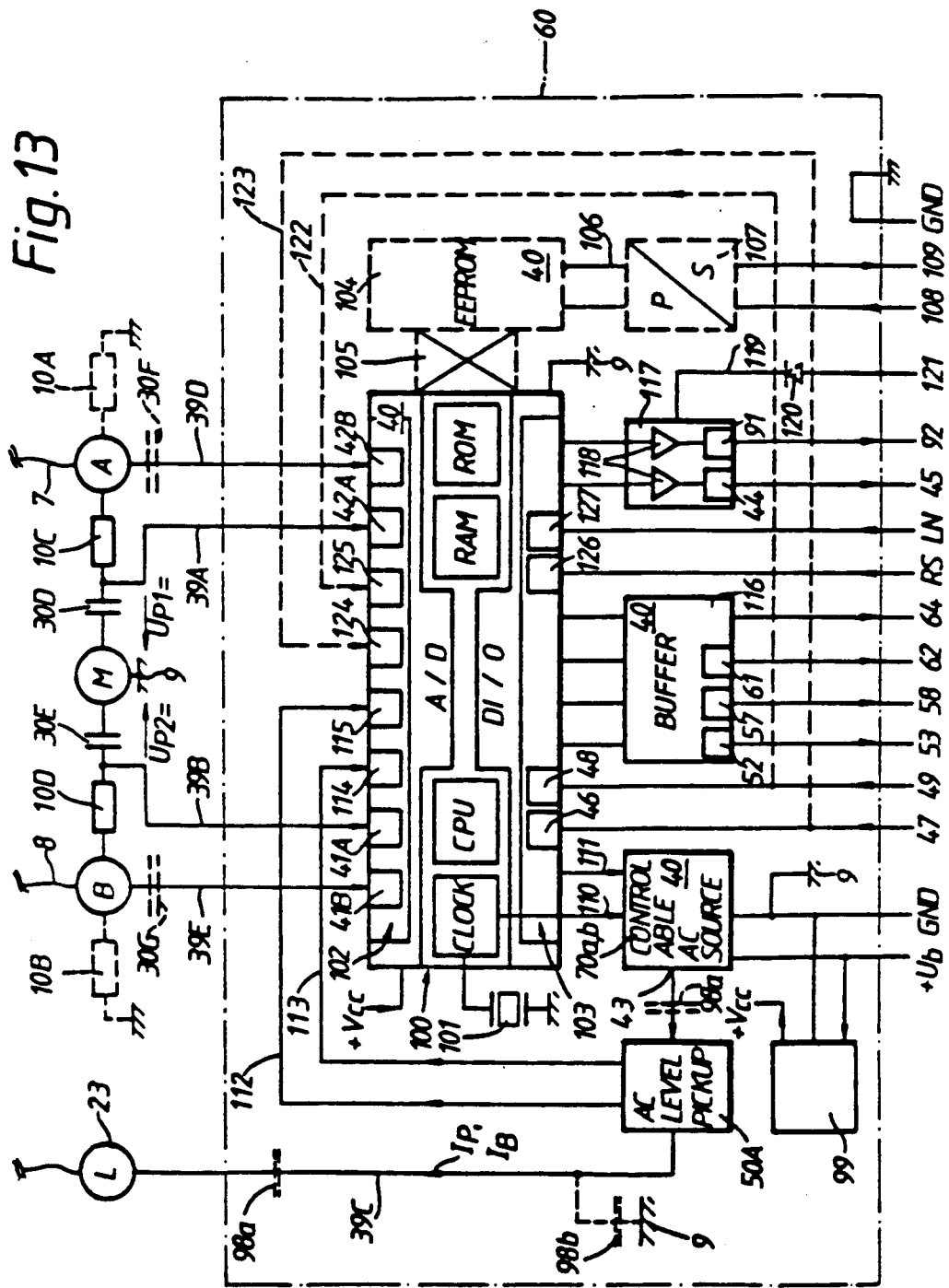
FIG. 13 is the block diagram of a third embodiment of the arrangement according to the teachings of the present invention which performs an analysis of direct-voltage and alternating-voltage components of the reading voltage/s by a micro-controller.

FIG. 13 shows a third embodiment of the invention which differs from that according to FIG. 6 by an integrated structure of the electronic feeding and analyzing system 60. The described logic and signal-analytical functions of the control device 40 and of the supply monitoring device 50 with the logic link 63 are, in this case, implemented largely by a modern one-chip A/D-micro-controller 100 with software to be executed by this controller and several simple and low-cost additional circuits. Parts 100 with 70a, b as well as 116 and 117, in this case, for example, correspond to the control device 40 from FIG. 6.

Common A/D-micro-controllers, Type micro-PD7811 (with EPROM; NEC), Type micro-PD7809 (with EPROM; NEC), type PD87312 (NEC); Type 83C552 (Valvo) or Type MCS-8051 (Intel) are suitable. Also suitable are multichannel signal processors for the processing of alternating-voltage signals, because these processors have special hardware structure characteristics (discriminators) and therefore permit a particularly simple programming for the present purpose. When an A/D-controller according to the CAN/VAN Standard is used, the arrangement can communicate with a computer-aided bus network, for example, in vehicles. For the signal exchange, the connecting lines to peripheral equipment described in the example, may then be replaced by a port according to the CAN/VAN Standard.

The circuit parts 28 and 29 from FIG. 6 were not repeated in FIG. 13 and should be understood to be connected to terminals [A], [B], [M] and [L]. Optional capacitances 98a and 98b, with respect to their functions, correspond to those of FIG. 6. In order to demonstrate the method of operation analogously to that of the arrangement according to FIG. 6, the same reference numbers as in FIG. 6 are used for important inputs, outputs and lines of the indicated interface to peripheral equipment.

The micro-controller 100 has known clock areas, CPU-areas, RAM- and ROM-areas; at least one multiplexed multichannel sample and hold analog/digital input port 102, in this case, constructed, for example, with eight channels with inputs 41B, 41A, 114, 115, 124, 125, 42A, 42B; and a separate, preferably multichannel digital input/output control port 103, particularly with digital inputs 46, 48, 126, which, by means of the mentioned lines 47, 48 and RS, are connected with peripheral equipment. Another digital input 127, by an instruction line "LN", is connected with peripheral equipment. For example, the micro-controller, during the initialization of the arrangement (installation; for example, in a vehicle still located on the assembly line), may receive a learning command over this line "LN", in order to, in the course of a learning routine, for example, the one-time complete turn of the installed steering wheel, learn the effects of the inherent tolerances of parts 28 and 29 as offset references, i.e., to store them in a nonvolatile manner. The micro-controller is supplied with a logical operating voltage $+V_{CC}$ from a voltage processing unit 99 fed with the vehicle voltage $+U_b$, and is connected with reference potential mass 9 just like the aforementioned voltage processing system. The clock generator of the micro-controller 100 is wired with a resonator 101, such as a ceramic or quartz resonator.

The series connection for the readout circuit 28 including a resistance 10C and a capacitor 30D arranged on the mass side is connected between the mass low end [M] and the terminal [A]. The terminal [A], in addition, may be connected with reference potential mass 9 via a resistance 10A. The terminal [A], possibly with an optional insertion of a direct-voltage blocking capacitor 30F is connected with the first analog input 42B via the connecting line 39D. A tap branching off between the capacitor 30D and the resistance 10C, by means of the connecting line 39A, is connected with the second analog input 42A. Between the mass low end [M] and the terminal [B], series connection including a resistance 10D and a capacitor 30E arranged on the mass side is connected. The terminal [B], in addition, by means of a resistance 10B, may be connected with reference potential mass 9. The terminal [B], possibly with an optional insertion of a direct-voltage blocking capacitor 30G is connected with the third analog input 41B by connecting line 39E. A tap, which branches off between the capacitor 30E and the resistance 10D is connected with the fourth analog input 41A by the connecting line 39B. Apart from a connection via a reference potential mass 9, a total of five connecting lines may be provided here between a read circuit 28 and the electronic feeding and analyzing system 60.

At a separate output 110, on the side of the micro-controller 100, a time or frequency signal is available which is program-linked with the clock frequency of the micro-controller 100. This output 110 is connected with an alternating-current or alternating-voltage source 70a or 70b, which obtains its operating power preferably from the vehicle voltage $+U_b$. An additional connection 111 may also be provided between micro-controller 100 and source 70a or 70b. The output 43 of AC source 40 is connected with a supply monitoring device 50A. A first output of the supply monitoring device 50A, via the feeding line 39C, is connected with the feeder terminal [L]. At least one second output, by means of line 113, is connected with the fifth analog input 114 of the A/D-port 102 of the micro-controller 100. An additional output of this type is also indicated which is connected with the sixth analog input 115 by line 112.

By means of a plurality of lines extending from the input/output control port 103, the micro-controller 100 is connected, for example, with a buffer 116, preferably a line driver array. It has the known outputs 52, 57, 61 to which outgoing signal lines 53, 58, 62 and 64 are connected. Via at least one separate line, the micro-controller 100 is connected with a power buffer 117, which contains at least one power switching amplifier 118, and from the switching output 44 (91), by means of line 45 (92), makes available the operating current for the operating device 56 (93) which is not shown. From line 121, for this purpose, by means of a separate line 119, the vehicle voltage is applied to the buffer 117, possibly by connecting a pole protection diode 120 in front.

As an option, the micro-controller, by a bus 105, may be connected with an E²PROM 104 with a pertaining operating control. This E²PROM, in turn, by means of lines 106 and a querying interface 107, perhaps with a parallel/serial converter or a bus modem, can be connected with peripheral equipment by one or several input and output lines 108 or 109. Such an E²PROM 104 in one housing with the actual micro-controller 100, in the manner of a known E²PROM-A/D micro-controller, may be integrated in series or as a customer-specific circuit. The bus 105 and lines 106 will then not be accessible.

Line 39C carries the testing alternating current $I_P$ or the operating current $I_B$, for the start of the operation of the consuming device 24 in the isolated circuit 29. The input lines 47 and 48, as an alternative or in addition, may also (in addition) be connected to the seventh and eighth analog input 124 and 125. In practice, the micro-controller will be connected with the peripheral equipment by additional lines which are not shown, or, in a known manner, may also cooperate with a watchdog circuit which is not shown here. The latter may also be an integrated component of the micro-controller.

The operation of the arrangement of FIG. 13 will be explained with reference to FIG. 14. The center-tapped series connections of resistances 10C or 10D and capacitors 30D or 30E, connected to terminals [A] and [B], are low-pass filters which make available respective direct-voltage parts $U_{P1=}$ and $U_{P2=}$ of the readout voltages at the mentioned capacitors. These direct voltages are located for querying at analog inputs 42A and 41A. In contrast, at the analog inputs 41B and 41B, the terminal voltages $U_{P1}$ or $U_{p2}$ are located which, in an unattenuated manner, contain the alternating-voltage components. Only their alternating-voltage components may also be present if high-passes filters, in the form of capacitors 30F and 30G, are connected in front.

The supply source 70a or 70b contains an amplifying or control element which affects the amplitude of the output signal. This amplifying and control element is capable of adjusting an alternating current, which is generated in the supply source by a generator and is amplified and synchronized to a reference frequency provided (line 110) by the micro-controller or an alternating current, which is provided (line 110) directly by the micro-controller and amplified, in such a manner that, at output 43, the testing alternating current $I_P$ or the operating alternating-current $I_B$ can be fed out.

An influencing of the level of the emitted alternating current/alternating voltage by the micro-controller 100 is provided by at least one control line 111. By this control line 111, when input 48 is controlled, for example, by a crash-sensor, at line 49, the alternating-current level is caused to change from $I_P$ to $I_B$. As mentioned, an increase of the output alternating current from the testing value $I_P$ to the operating value $I_B$ may take place also without connection 111, by the switching-over of the frequency emitted on line 110, as an example, in connection with an optional transformation or ballast capacitance 98a or 98b, analogously to FIG. 6, according to whether output 43 has a voltage or current source characteristic.

The supply monitoring device 50A, in comparison to the supply monitoring device 50 according to FIG. 6, has a reduced function because all signal evaluations and analyses, in this case, take place in the micro-controller 100 in a software-aided manner. Accordingly, in the supply monitoring device 50A, only one measuring signal is obtained which characterizes the emitted alternating current and/or the voltage at output 43. For this purpose, the supply monitoring device 50A may be constructed and act, for example, as a known directional coupling circuit. Such measuring signals are fed into the analog inputs 114 and 115 and are cyclically scanned by the micro-controller 100 by a reading into the A/D converter according to the program specification.

To this extent, the micro-controller 100 with 102, 103, the control line 111, the influenceable source 70a/70b, 50A, and the line/s 112 and 113 returned to the A/D port 102 form an analog/digital closed loop arrangement for the monitoring, stabilizing and/or adjusting of the alternating current/voltage which, by line 39C, can be fed into terminal [L]. A breakdown of the feed alternating voltage or a failure or an incorrect value of the feed alternating current are thus sensed by the micro-controller inloop and by means of software, are converted into the described warning signals.

The active analysis of the momentary voltages present at analog inputs 42A, 42B, 41A, 41B takes place by the arithmetical processing of the cyclically scanned voltage samples. FIG. 14-(1) shows the sinusoidal or rectangular variance in time of waveforms 65 or 65' respectively of the driving alternating current/alternating voltage. The frequency of this voltage is the result of the frequency division of the controller-internal clock signal CP, as shown in FIG. 14-(4). For example, a period length of the variation time of waveforms 65 or 65' comprises a total of 256 clock pulses (CP1 to CP256; assumed division factor 1/256).

As mentioned, this division factor can be shifted by software; for example, in the case of the control of input 48, for the increase of the driving alternating current from the testing level $I_P$ to the operating level $I_B$ by increasing or lowering the driving frequency.

Figure 14:
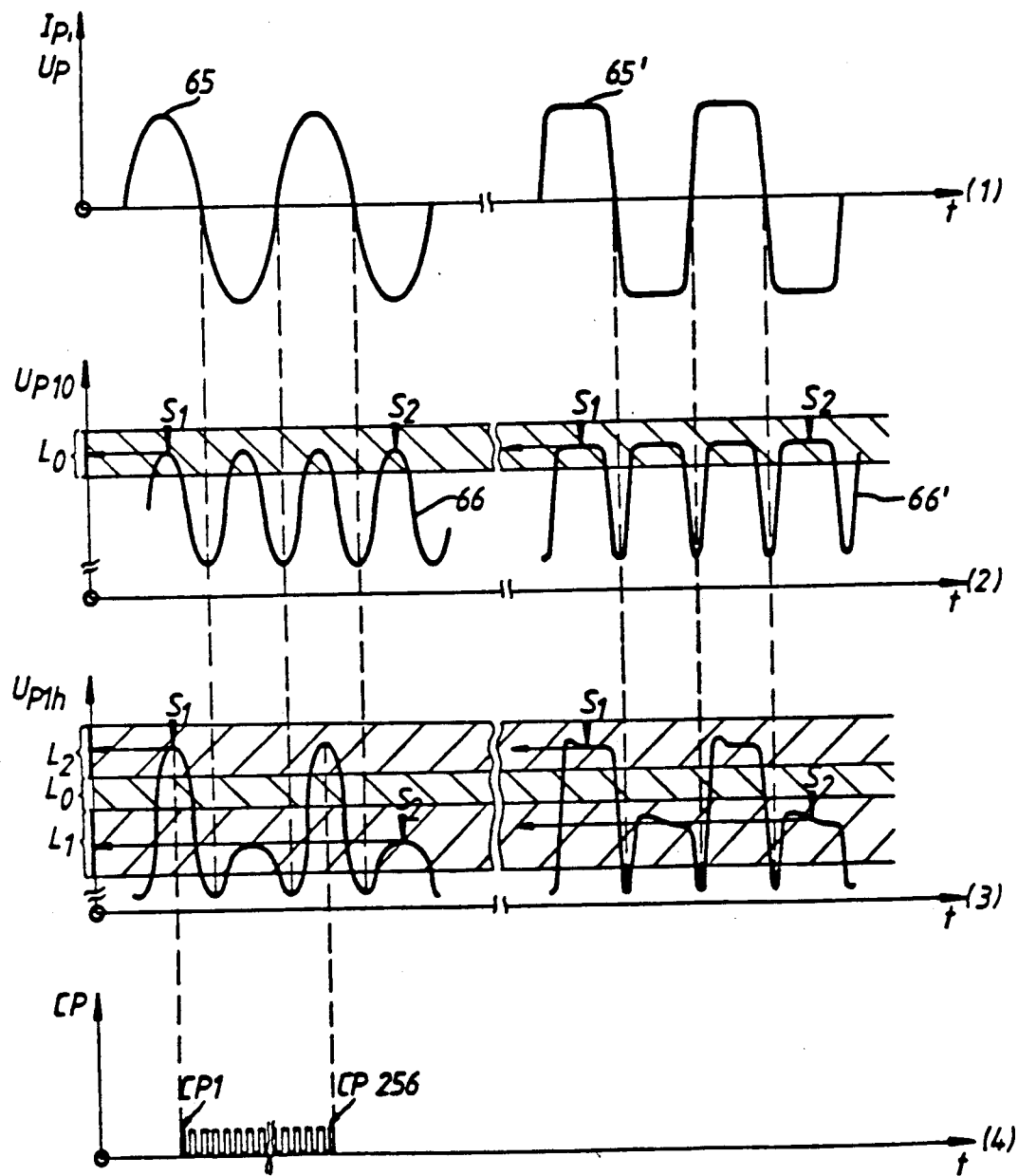
FIG. 14 shows schematic time-dependency diagrams for demonstrating a synchronous sampling method for analyzing the reading voltages.

FIG. 14-(2) shows the terminal voltage $U_{P10}$ in the testing condition (inoperative condition) without any actuating of the touch contact switch 38b (38b'). Voltage $U_{P20}$ at the analog input 41B, which is not shown, has a corresponding course. At points in time, which are defined with respect to the clock pulse, momentary values $S_1, S_2, \ldots S_n$ from input 42B, and corresponding momentary values from input 41B, are read into the micro-controller 100, specifically preferably after, in each case, $n+\frac{1}{2}$ period lengths of variance in time of waveform 65 or $2(n+\frac{1}{2})$ period lengths of variance in time of waveform 66 or 66' of the alternating-voltage component of the reading voltage $U_{P10}$ or $U_{P20}$. The reading-in of these values takes place in a manner, which is known per se, by very short-time scanning (sample & hold) in connection with a subsequent A/D conversion.

Thus, the half waves in the reading voltage waveform 66 originating from a positive and a negative half wave of the driving quantity $I_P$ or $U_P$ are alternately queried, in which case preferably not directly successive half waves, but half waves are sensed which, with respect to time, are further apart, which is easily possible as a result of the clock-synchronous triggering of all readings, i.e., because of their clock-linked assignment among one another. The corresponding scannings of the reading voltage $U_{P20}$ at input 41B take place with a certain offsetting of time interlaced between readings $S_1, S_2, \ldots S_n$ input 42B.

In this manner, a harmonic utilization of the A/D port 102 is achieved and a sufficient amount of time is made available to the micro-controller 100 for signal-processing computations between individual readings. In the testing condition, the scanned momentary values $S_1, S_2, \ldots S_n$ are located within an idling or test reading voltage window $L_O$ which is determined by software and is possibly learned by means of software initially during the first operation as described previously. Scanning values which, when classified over long time periods, continuously fall into this window, do not trigger any warning or defect reporting routine and are analyzed by the software as being correct.

FIG. 14-(3) shows the conditions in the case of the actuating of a touch contact switch 38b or in the case of a defect, for example, its defective short circuit. The scanning values $S_1, S_2, \ldots S_n$ will now no longer be located within the test reading window $L_O$, but simultaneously in adjacent actuating or defect reading windows $L_1$ and $L_2$. The alternating reading-in of scanning values from windows $L_1$ and $L_2$ leads to the recognition and implementation of an actuating command, as described. A presence of this reading situation at the time of the connecting of the gate trigger current circuit (turn-on) before the expiration of a recognition delay time $T_{VO}$ or longer than determined by a time mask $W_3$ permissibly established according to FIG. 12-(3), leads to the recognition of a defect condition and to the emission of a warning signal and the implementation of correspondingly programmed safety routines. The queries of the direct-voltage values from inputs 42A and 42B, with respect to time, are in parallel with these analyses, to the extent that they are scattered into the sequence of the alternating quantity scanning according to the programmed query plan in a time-interlaced manner. The sole analyzing of, for example, the direct voltages at analog inputs 42B and 42A, when a touch contact switch 38a is actuated, is self-explanatory in view of what was mentioned above.

The partial redundancy with respect to the recognition of defects, for example, failure of the driving quantity $I_P$ as the cause of a permissible reading voltage $U_{AB}=0$, which, with respect to the hardware, is established by separate parts 40 and 50 of the electronic system according to FIG. 6, in this case is replaced by a multichannel and quasi-simultaneous parallel analyzing of direct and alternating components of the reading voltages. To this extent, all signal-analyzing and logic functions of parts 40 and 50, in this case, are combined in one housing in the micro-controller 100. Except for the separation of direct and alternating parts of the reading voltages, all hardware functions according to FIG. 9 in micro-controller 100 are emulated by software.

An example of such further reaching functions is the provided by hardware ability to analyze command and trigger voltages on lines 47 and 49, these lines 47 and 49, being connected with (the remaining two of the total of eight) analog inputs 124 and 125 by lines 123 and 122 drawn by interrupted lines. In case of such latter connection the acquisition of respective signals through digital inputs 46 and 48 may be omitted by that respective (digital) instructions are ten sensed analogously. Such an analog analyzing of actually digital command or trigger signals on lines 47, 49 offers the advantage that a corresponding course of a triggering control voltage can be analyzed precisely with respect to its time-related structure, its amplitude, its sufficiently long uniform presence, etc. Further, the control voltages, which do not comply with any programmed protocol, can also be analyzed as being defective, can be processed as a corresponding warning signal and at least do not lead to the triggering of an operating device. Abnormal inductive leaks on (for example, unshielded) lines 47 and 49 can therefore be differentiated easily from true triggering signals.

Additionally, an inputting of corresponding commands from lines 47 and 49, at digital inputs 46 and 48 as well as at the analog port 102, permit far-reaching fail-safe routines. For example, to the extent that a trigger signal voltage violates the protocol because it is too low, nevertheless will lead to the regular triggering of the corresponding operating device (for example, opening of the central locking system, start of the operation of the emergency flasher system), if previously the "gain" of the feed source 70a, 70b (by means of line 111) had to be increased atypically to maintain a given output level of $I_P$ because of a defective drop of the vehicle voltage. Thus an indirect inloop measuring of the vehicle voltage is accomplished with the utilization of the aforementioned alternating test current control loop.

By the optional serial or parallel bus 105, during the initialization of the arrangement (installation), status data, and later data concerning defect conditions or their codes may be read into the optional E²PROM 104. For this purpose, it may have a corresponding sequence control. The transfer interface 107, which also contains protective functions, for example, having a parallel/-serial converter, after being called via line 108, permits the serial reading-out via line 109 of the data filed in the E²PROM 104.

The function of elements 46, 47, 48, 49, 52, 53, 57, 58, 61, 62, 64, 44, 45, 91, 92 and RS is identical with those known from FIG. 6. The providing of special buffer modules 116 and 117 is used mainly for the protection of the micro-controller 100, for example, in the case of short-circuiting, short-circuiting of the vehicle power supply, defective current feedback from the vehicle or accidental faulty connecting of individual connecting lines. Since the output drivers of buffer 117 are capable of supplying current of a magnitude of ten amp., the vehicle voltage is fed to the buffer 117 via a separate supply line 121. A separate mass connection GND is provided in this context.

This embodiment of the arrangement according to the invention is suitable for the integration into a larger system, for example, an inertial vehicle management system. Depending on the application software, it offers the possibility of the installation of arbitrarily intensive failsafe functions.

For this purpose, the arrangement comprises only a few parts of a comparable degree of reliability and can be constructed such that, in an initialization condition, it can learn inherent tolerances or status data, in the case of no-defect circuit parts 28 and 29 and can later again and again use these data as reference values by calling the memory. An unnecessarily precise manufacturing of electromechanical parts and high adjusting expenditures are therefore not required.

In addition, it is also possible in this embodiment to supply, in the testing condition, a smaller electronic device, such as a steering wheel computer (which may possibly be buffered by means of a chargeable energy storage device) from measuring points [Y] and [Z] with operating power and to operate it independently of the remaining arrangement.

The arrangement according to the invention can be used universally. The explanation of its operation when, as an example, it is used in a motor vehicle, cannot be misunderstood to represent a limitation of the generality of the invention. The trigger dot of an occupant protection system, for example, of an airbag in the steering wheel of a motor vehicle, therefore can be replaced by any arbitrary electrical consuming device. Correspondingly, the horn and the emergency flasher system may also be replaced by a completely different operating system, for example, those triggered by the operator interface of a machine tool, etc.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. An arrangement for the inductive querying of an isolated circuit having at least one electrical consuming device to be monitored comprising;
   a) a first isolating transformer having a first primary winding, a first readout winding, and a first secondary winding which are inductively coupled;
   b) a second isolating transformer having a second primary winding, a second readout winding and a second secondary winding which are inductively coupled;
   c) the first and second isolating transformers having essentially the same characteristics and independent magnetic fields;
   d) a first circuit path of the isolated circuit for supplying the at least one electrical consuming device with power from both the first and second secondary windings;
   e) at least one simulation device and a second circuit path of the isolated circuit for supplying said at least one simulation device with power from both the first and second secondary windings; and
   f) a readout circuit connected to the first and second readout windings for providing a readout of the inductive querying of the isolated circuit by a feeding quantity fed to the first and second primary windings.

2. An arrangement according to claim 1, wherein the simulation device in the second current path is a resistance.

3. An arrangement according to claim 1, comprising independent first and second arrangement parts, the first arrangement part containing the first and second primary windings and the first and second read windings and the second arrangement part containing the first and second secondary windings.

4. An arrangement according to claim 3, wherein both arrangement parts include magnetic field guiding devices cooperating with the windings of the first and second isolating transformers.

5. An arrangement according to claim 3, wherein the first and the second arrangement parts are arranged to be movable with respect to one another.

6. An arrangement according to claim 5, wherein the first and second arrangement parts are rotatable with respect to one another, and wherein an air gap existing between field guiding devices of the first and the second arrangement parts in the case of rotation, remains essentially unchanged.

7. An arrangement according to claim 6, wherein the windings in the first arrangement part and in the second arrangement part are each arranged concentrically with respect to one another.

8. An arrangement according to claim 1, wherein the first and second primary windings are connected in series so that both the first and second primary winding are acted upon by the feeding quantity and wherein the first and second secondary windings are connected in series in a voltage-adding manner.

9. An arrangement according to claim 1, wherein a first series connection means is provided in the isolated circuit and at least second and third series connections means of the same structure are provided in the readout circuit, each series connection means comprising four semiconductor switches, each having an anode side and a cathode side which are connected to form a bridge circuit having two switch paths switched in parallel for conducting current of the same polarity and tapped in the center, having a common end on the anode side and a common end on the cathode side as well as a first center tap and a second center tap.

10. An arrangement according to claim 9, wherein, in the isolated circuit, the at least one electrical consuming device is connected between a connecting point of the first and second secondary windings and the cathode side of the first series connection means, the simulation device is connected between the connecting point of the first and second secondary windings and the anode side of the first series connecting means, an end of the first secondary winding is connected at the first center tap of the first series connection means, a start of the second secondary winding is connected at the second center tap of the first series connection means; and wherein the readout circuit has first and second readout terminals which are connected with the first and second readout windings by the second and third series connection means, the anode sides of the second and third series connection means being connected with a reference potential means, the first readout terminal being connected with the cathode side of the second series connection means, a start of the second readout winding being connected with the first center tap of the second series connection means, an end of the first readout winding being connected with the second center tap of the second series connection means, the second readout terminal being connected with the cathode side of the third series connection means, a start of the first readout winding being connected with the first center tap of the third series connection means, an end of the second readout winding being connected with the second center tap of the third series connection means.

11. An arrangement according to claim 10, wherein between the first and second readout terminals and a reference potential ground which forms a ground, first and second testing voltages respectively are tapped, wherein the first and second testing voltages, in the case of the same resistances of the consuming device and the simulation device, are approximately identical, wherein a larger or smaller testing voltage at a readout terminal corresponds to a resistance of the consuming device that is larger or smaller with respect to the simulation device, and wherein when the resistance of at least one of the consuming device and of the simulation device changes, the first and second testing voltages change in opposite directions.

12. An arrangement according to claim 10, wherein, in addition, the first and second primary windings are each bridged by first and second semiconductor switch arrangements, anodes of the first and second semiconductor switch arrangements being connected with a connecting point of the first and second primary windings, so that, when a low primary alternating current is fed, supplied electrical power is distributed equally to the consuming device and the simulation device and, when an increased primary alternating current is fed, electrical power is mainly supplied to the consuming device.

13. An arrangement according to claim 12, wherein the first and second bridging semiconductor switch arrangements are each formed of at least one identically constructed series connection of, in each case, four corresponding switch paths in a bridge arrangement, the center taps of which are eliminated.

14. An arrangement according to claim 10, wherein the first, second and third series connection means and the first and second bridge semiconductor switch arrangements are each constructed as single-body discrete structural element with four lines.

15. An arrangement according to claim 10, wherein the anode and the cathode sides of the bridging circuits are exchanged.

16. An arrangement according to claim 1, wherein first, second and third measuring points are provided in the isolated circuit, the first measuring point being connected with the connecting point of the first and second secondary windings of the consuming device and of the simulation device, the second measuring point being connected with the other line of the consuming device, and the third measuring point being connected with the other line of the simulation device.

17. An arrangement according to claim 16, wherein a power supply for an additional electronic safety and measuring device is provided by connecting the electronic device across at least any two of the first, second and third measuring points of the isolated circuit.

18. An arrangement according to claim 17, wherein the additional electronic safety and measuring device includes means for at least one of measuring, analyzing and indicating of a direct voltage between at least two of the three first, second and third measuring points of the isolated circuit.

19. An arrangement according to claim 17, wherein the additional electronic safety and measuring device includes a chargeable power storage device which is buffered by electrical power obtained via at least one of the first, second and third measuring points.

20. An arrangement according to claim 17, wherein the additional electronic safety and measuring device means for storing an actual measured or indicated value at commencement of an operation of the consuming device.

21. An arrangement according to claim 17, wherein the additional electronic safety and measuring device includes at least one clock with a read device.

22. An arrangement according to claim 10, wherein two unconnected ends of the first and second primary windings are connected between a feeder terminal and a ground terminal which is connected with a reference potential ground either directly or via a series connected matching/transformation capacitance which is tuned to permit high current flow at a given frequency, and wherein the first and second readout terminals and the feeder terminal are connected with an electronic feeding and analyzing system by one respective line each.

23. An arrangement according to claim 22, wherein the ground terminal and the electronic feeding and analyzing system are connected with one another by a broad metal surface.

24. An arrangement according to claim 22, wherein the electronic feeding and analyzing system has a plurality of inputs including at least first and second measuring inputs and at least one feeding output, the readout terminals being in operative connection with the first and second measuring inputs and the at least one feeding output being at least one of an alternating-current, and alternating-voltage feed source providing an alternating feed quantity and being at least indirectly operatively connected with the feeder terminal.

25. An arrangement according to claim 24, wherein one smoothing capacitor, respectively, is connected between at least one of each of the readout terminals and first and second measuring inputs of the electronic feeding and analyzing system, and the ground.

26. An arrangement according to claim 24, wherein an matching/transformation capacitance is inserted in a supply path between at least one of the feeding output of the electronic feeding and analyzing system, and the feeder terminal.

27. An arrangement according to claim 24, wherein an matching/transformation capacitance is inserted between at least one of a feed line of the feeding output and the feeder terminal, and the reference potential ground.

28. An arrangement according to claim 24, wherein the electronic feeding and analyzing system also has at least one third input, which can be externally controlled, and wherein the alternating quantity, which can be fed to the feeder terminal from the at least one feeding output, in the case of a first signal condition at the at least one third input, has a first testing value and in the case of a second signal condition, has a second operating value greater than the first testing value.

29. An arrangement according to claim 28, wherein during the transition from a first to a second signal status, the frequency of the alternating quantity from the at least one feeding output will change.

30. An arrangement according to claim 24, wherein in the electronic feeding and analyzing system, a supply monitoring device is provided which is in operative connection with a feed line and acts upon an alarm output, from which, responsive to a deviation from a predetermined value of the alternating feed quantity from the at least one feeding output, an alarm signal can be transmitted to peripheral equipment.

31. An arrangement according to claim 24, wherein, in the electronic feeding and analyzing system, a control device/is provided having as inputs said plurality of measuring inputs fed by the readout terminals and/further having said at least one feeding output of the feed source;
wherein the control device has warning signal output, from which, in the case of predetermined signal conditions at the plurality of measuring inputs of the control device, a warning signal is transmitted to peripheral equipment.

32. An arrangement according to claim 24, wherein an alarm output (of a supply monitoring device) and a warning output (of a control device) are logically linked so as to provide a status condition report of the arrangement and wherein the status condition report can be transmitted to peripheral equipment by a disturbance reporting line.

33. An arrangement according to claim 30, wherein the supply monitoring device has a switching output from which, as a function of the value of at least one alternating feed quantity, an external operating device can be acted upon by operating current.

34. An arrangement according to claim 31, wherein the control device also has an output from which, with a certain predetermined time delay, after the change of the signal condition at one of the plurality of inputs of the electronic feeding and analyzing system, a switching signal is transmitted to peripheral equipment.

35. An arrangement according to claim 1, wherein at least one switching contact is provided by which, when actuated, at least one of the first and second series-connected secondary windings is short-circuited.

36. An arrangement according to claim 1, wherein at least in one of the first and second current path feeding the simulation device and the consuming device, a switching contact is provided which when actuated interrupts the associated current path.

37. An arrangement according to claim 16, wherein at least one switching contact is provided by which, when actuated, two of the three first, second and third measuring points are short-circuited.

38. An arrangement according to claim 31, wherein the control device, in addition, has switching output from which an external operating device is acted upon by an operating current.

39. An arrangement according to claim 38, wherein the control device, in addition, has at least another input to which a triggering signal can be fed, and in that, when an alarm signal is present at this input, at least one external operating device can be acted upon by an operating current.

40. An arrangement according to claim 31, wherein the control device has another output from which defect conditions are transmitted to peripheral equipment in a coded manner.

41. An arrangement according to claim 31, wherein the control device contains voltage window comparator means for at least one of a discrimination and classification of at least one voltage value range, preferably a multiwindow compare function.

42. An arrangement according to claim 31, wherein the control device contains analyzing means for at least one of a synchronous sampling and phase detection of at least a ground wave component of the alternating feeding quantity.

43. An arrangement according to claim 31, wherein the control device of the electronic feeding and analyzing system comprises an A/D-micro-controller having a multichannel analog input port and a multichannel digital I/O-port,
wherein at least two analog inputs as measuring inputs, are operatively connected with the readout terminals, and
wherein at least one of the alternating-voltage and alternating-current sources is influenced by a digital output port of the A/D-micro-controller.

44. An arrangement according to claim 43 wherein between each of the readout terminals and the ground, a readout series connection means is connected including a capacitor adjacent a ground side of the connection means and a resistance adjacent a terminal side of a readout series connecting means, and wherein from center taps of the readout series connection means, third and fourth read lines are led to third and fourth measuring inputs of the control device.

45. An arrangement according to claim 43, wherein blocking capacitances are inserted into read lines which directly connect readout terminals with measuring inputs of the control device.

46. An arrangement according to claim 43, wherein the alarm output of the supply monitoring/device embodies as a digital output of the A/D-micro-controller, and wherein the supplymonitoring/device has at least one signal output including a feed source monitoring output, and wherein each of these at least one signal outputs is operatively connected with a respective additional analog input of the A/D-micro-controller.

47. An arrangement according to claim 43, wherein at least one of the alternating-voltage and alternating-current sources via at least one control path is influenced by a digital output port of the A/D-micro-controller to provide a clock signal.

48. An arrangement according to claim 43, wherein the electronic feeding and analyzing system has at least one reset input to which, when a reset key is actuated, a signal can be fed which resets at least one of a warning signal and an alarm emission.

49. An arrangement according to claim 24, wherein the electronic feeding and analyzing system has at least one reset input to which, when a reset key is actuated, a signal can be fed which resets at least one of a warning signal and an alarm emission.

50. An arrangement according to claim 43, wherein in the electronic feeding and analyzing system includes a nonvolatile, electrically alterable memory which can be read by the A/D-micro-controller according to a program, wherein a learning signal can be fed to the A/D-micro-controller via a separate digital input, and wherein when a learning signal is present, at least one of status, offsetting and defect data computed from signal voltages present at the analog input port can be written into the nonvolatile memory.

51. An arrangement according to claim 50, including a bus line over which the memory can be at least queried by peripheral equipment.

52. An arrangement according to claim 43, wherein at least one control line acting upon a digital input of the A/D-micro-controller is, in addition, connected with one individual analog input respectively.

53. An arrangement according to claim 48, wherein the electronic feeding and analyzing device comprises activation means for controlling at least one of a warning and alarm output and a switching output for operating an operating device in dependence upon the actuation of the reset key by:
 a) triggering an alarm delay period and, after the expiration of this delay period, emitting a time-limited switching signal from the switching output for an extreme start-up of the operating device,
 b) triggering a time-limited, but periodically continuously repetitive, warning signal or alarm signal from the control device with a repetition period length which is significantly shorter than the alarm delay time,
 c) suppressing significant parts of the continuously repetitive warning or alarm signal to provide a warning or alarm signal which has a slower rate only if the reset key is actuated before the expiration of the alarm delay period,
 d) keeping the warning and alarm output inactive after a switching-off and switching-back-on of an operating voltage of the arrangement until a new defect criterion is met.

54. An arrangement according to claim 49, wherein the electronic feeding and analyzing device comprises activation means for activating at least one of a warning and alarm output and a switching output for operating an operating device in dependence upon the actuation of the reset key by:
 a) triggering an alarm delay period and, after the expiration of this delay period, emitting a time-limited switching signal from the switching output for an extreme start-up of the operating device;
 b) triggering a time-limited, but periodically continuously repetitive warning signal or alarm signal from the control device with a repetition period length which is significantly shorter than the alarm delay time;
 c) suppressing significant parts of the continuously repetitive warning or alarm signal to provide a warning or alarm signal which has a slower rate only if the reset key is actuated before the expiration of the alarm delay period;
 d) keeping the warning and alarm output inactive after a switching-off and switching-back-on of an operating voltage of the arrangement until a new defect criterion is met.

55. An arrangement according to claim 53, wherein suppression of essential parts of the continuously repetitive warning or alarm signal is inhibited when a current flow from the switching output into the operating device was previously obstructed.

56. An arrangement according to claim 54, wherein suppression of essential parts of the continuously repetitive warning or alarm signal is inhibited when a current flow from the switching output into the operating device was previously obstructed.

57. An arrangement according to claim 31, wherein the electronic feeding and analyzing system comprises limiting means for, after receiving a read signal characterizing a switching contact actuating of a switch of the isolated circuit or a defect, limiting current supply to an operating device operated by the arrangement with respect to time wherein:
 a) when the read signal occurs, its leading edge sets a time mask having a constant duration which is dimensioned to be as large as an uninterrupted maximally permissible actuating time of the operating device;
 b) when the read signal dies down during the expiration of the time mask, each subsequently occurring read signal sets the time mask anew upon sensing of its leading edge; and
 c. when the read signal does not die down during the expiration of the time mask, and the time mask expires, the operating device is disconnected from an operating device driving switching output of the arrangement and this condition is stored as a defect criterion.

58. An arrangement according to claim 57, wherein activation means are provided which, after the storing of the defect criterion, activate warning or alarm output and the corresponding switching output.

59. An arrangement according to claim 57, wherein the electronic feeding and analyzing system comprises additional analyzing means for analyzing the occurrence of an actuating signal representing a switching contact actuation before the expiration of an initial recognition delay time period and for charcterizing this activating signal as an alarm condition.

60. An arrangement according to claim 3, including means for fastening the first arrangement part to a vehicle or its chassis, and means for fastening the second arrangement part to a wheel.

61. An arrangement according to claim 60, wherein the wheel is the steering wheel of a vehicle and the electrical consuming device is trigger device of an occupant protection system housed in the steering wheel, particularly of an airbag.

62. An arrangement according to claim 48, wherein the reset key is arranged in an access space for an operator of a vehicle.

63. An arrangement according to claim 62, wherein at least one switching contact is provided in the isolated circuit located at a steering wheel for the actuating of a horn.

64. An arrangement according to claim 62, wherein at least one switching contact is provided at the steering wheel for the triggering of an emergency flasher system.

65. An arrangement according to claim 35, wherein at least one further switching contact for testing purposes is housed at a steering wheel in a protected manner.

66. An arrangement according to claim 61, wherein at least one further switching contact for testing purposes is housed at a steering wheel in a protected manner.

67. An arrangement according to claim 53, wherein an inactivating of the warning or alarm output takes place by a brief actuating of an ignition lock switch.

68. An arrangement according to claim 54, wherein an inactivating of the warning or alarm output takes place by a brief actuating of an ignition lock switch.

* * * * *